(12) United States Patent
Okamoto et al.

(10) Patent No.: US 9,385,720 B2
(45) Date of Patent: Jul. 5, 2016

(54) SEMICONDUCTOR DEVICE AND DRIVING METHOD THEREOF

(71) Applicant: Semiconductor Energy Laboratory Co., Ltd., Atsugi-shi, Kanagawa-ken (JP)

(72) Inventors: Yuki Okamoto, Kanagawa (JP); Yoshiyuki Kurokawa, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/643,288

(22) Filed: Mar. 10, 2015

(65) Prior Publication Data

US 2015/0263734 A1     Sep. 17, 2015

(30) Foreign Application Priority Data

Mar. 13, 2014   (JP) ................................ 2014-050500
Mar. 14, 2014   (JP) ................................ 2014-051645

(51) Int. Cl.
*H03K 19/0185*   (2006.01)
*H03K 19/0944*   (2006.01)

(52) U.S. Cl.
CPC .... *H03K 19/018507* (2013.01); *H03K 19/0944* (2013.01)

(58) Field of Classification Search
None
See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 5,859,544 A * | 1/1999 | Norman | G11C 7/1045 326/38 |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 6,978,386 B2 * | 12/2005 | Gareis | G05B 19/054 323/265 |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,129,747 B1 * | 10/2006 | Jang | H03K 19/17736 326/37 |
| 7,211,825 B2 | 5/2007 | Shih et al | |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Alexander H Taningco
*Assistant Examiner* — Nelson Correa
(74) *Attorney, Agent, or Firm* — Fish & Richardson P.C.

(57) ABSTRACT

A semiconductor device in which operation delay can be suppressed is provided. The semiconductor device includes a first logic element, a second logic element, a first circuit that has a function of controlling conduction between the first logic element and the second logic element, and a fourth circuit. The fourth circuit is electrically connected to the first circuit, and is electrically connected to the second logic element.

16 Claims, 15 Drawing Sheets

(56) References Cited

U.S. PATENT DOCUMENTS

| | | |
|---|---|---|
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,463,055 B2 * | 12/2008 | Ciccarelli ........ H03K 19/17736 326/38 |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,542,034 B2 | 9/2013 | Kato |
| 8,547,753 B2 | 10/2013 | Takemura et al. |
| 8,952,722 B2 | 2/2015 | Ikeda et al. |
| 8,952,723 B2 | 2/2015 | Aoki et al. |
| 8,970,251 B2 * | 3/2015 | Kurokawa ....................... 326/38 |
| 8,970,253 B2 * | 3/2015 | Kurokawa .......... H03K 19/0013 326/38 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0101351 A1 | 5/2011 | Yamazaki |
| 2012/0293200 A1 | 11/2012 | Takemura |
| 2013/0314124 A1 | 11/2013 | Ikeda et al. |
| 2013/0321025 A1 | 12/2013 | Kurokawa et al. |
| 2014/0159771 A1 | 6/2014 | Ikeda et al. |
| 2014/0176185 A1 | 6/2014 | Kurokawa |
| 2015/0008958 A1 | 1/2015 | Kurokawa |
| 2015/0256182 A1 * | 9/2015 | Okamoto ........... H03K 19/1776 326/38 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2013-251894 | 12/2013 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transistion:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of

(56) References Cited

OTHER PUBLICATIONS

International Electron Devices Meeting, Dec. 5, 2005, pp. 1067-1069.
Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.
Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Janotti.A et al., "Native Point Defects in ZnO", Phys. Rev. B (Physical Review. B), Oct. 4, 2007, vol. 76, No. 16, pp. 165202-1-165202-22.
Janotti.A et al., "Oxygen Vacancies in ZnO", Appl. Phys. Lett. (Applied Physics Letters) , 2005, vol. 87, pp. 122102-1-122102-3.
Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kim.S et al., "High-Performance oxide thin film transistors passivated by various gas plasmas", 214th ECS Meeting, 2008, No. 2317, ECS.
Kimizuka.N. et al., "Spinel,YBFE2O4, and YB2FE3O7 Types of Structures for Compounds in the In2O3 and Sc2O3-A2O3-BO Systems [A; Fe, Ga, or Al; B: Mg, Mn, Fe, Ni, Cu,or ZN] at Temperatures over 1000° C.", Journal of Solid State Chemistry, 1985, vol. 60, pp. 382-384.
Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO Systems", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits , 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED", IDW '06 : Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : International Symposium Digest of Technical Papers, May 20, 2008, vol. 39, pp. 625-628.
Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "SUFTLA Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., The phase relations in the In2O3—Ga2ZnO4—ZnO system at 1350° C., Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-345202-6.

(56) References Cited

OTHER PUBLICATIONS

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZn04", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

FIG. 10A
FIG. 10C
FIG. 10B
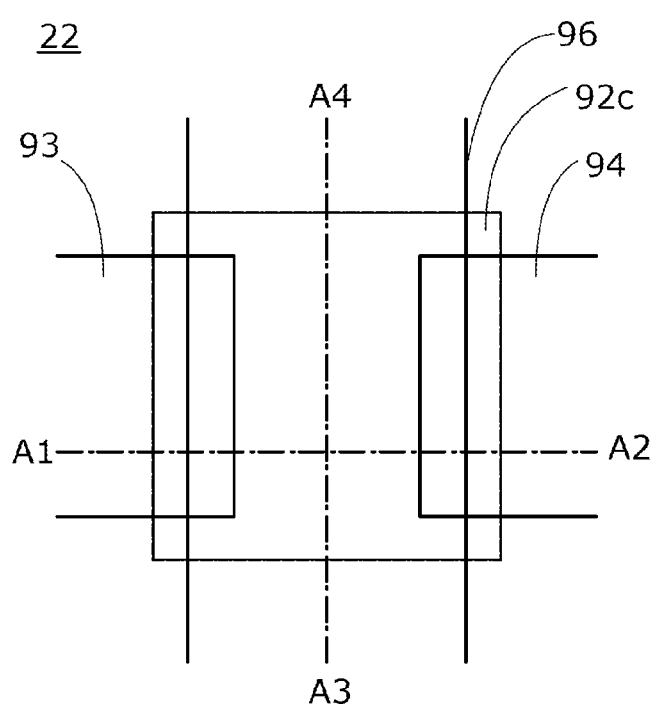
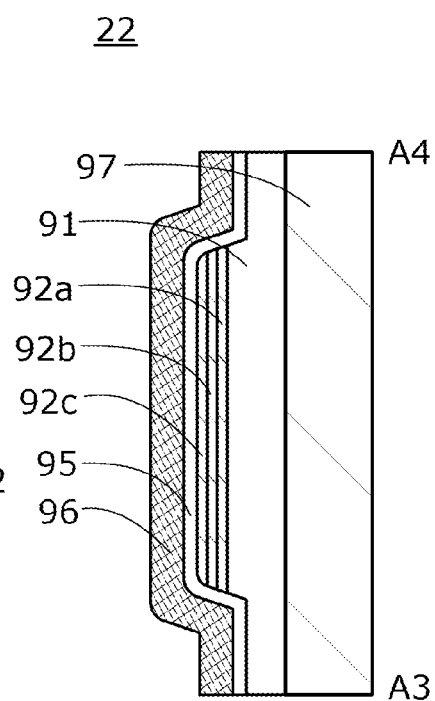
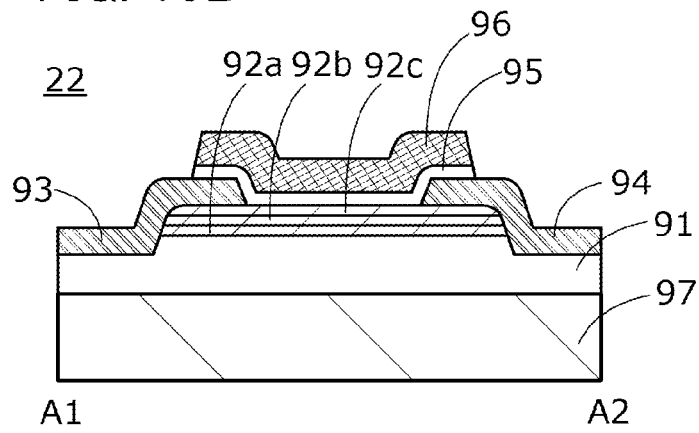

SEMICONDUCTOR DEVICE AND DRIVING METHOD THEREOF

BACKGROUND OF THE INVENTION

1. Field of the Invention

The technical field of one embodiment of the invention disclosed in this specification, drawings, and the like relates to an object, a method, or a manufacturing method. Alternatively, it relates to a process, a machine, manufacture, or a composition of matter. Specifically, one embodiment of the invention relates to a semiconductor device and a driving method thereof. More specifically, one embodiment of the invention relates to a programmable logic device and a driving method thereof.

2. Description of the Related Art

An application specific integrated circuit (ASIC) is a circuit in which all circuits are fixed at the time of manufacture, whereas a programmable logic device (hereinafter also referred to as PLD in this specification) is a device that can function with an intended circuit structure set by a user after the shipment. The PLD described in this specification includes all of the following in its category: a simple PLD (SPLD), which is small in the logic scale; a complex PLD (CPLD), which is medium in the logic scale; and a field programmable gate array (FPGA), which is large in the logic scale.

In general, a PLD includes arrayed logic elements (hereinafter also referred to as LE in this specification) and circuits (switches) that control conduction between the LEs. The function of a PLD can be changed by changing the functions of the LEs. In addition, the function of a PLD can also be changed by changing the connection between the LEs with the circuits that control conduction between the LEs.

A circuit that controls conduction between LEs incorporates a configuration memory that can store configuration data.

A PLD having a multi-context function, which incorporates configuration memories that can store plural sets of configuration data and switches a set of configuration data with another set of configuration data during the operation of the PLD, is known. A PLD having the multi-context function performs an operation in accordance with the selected configuration data, and is capable of rewriting non-selected configuration data during the operation, i.e., capable of performing dynamic reconfiguration. A PLD capable of dynamic reconfiguration is disclosed in Patent Document 1 below.

REFERENCE

Patent Document

[Patent Document 1] Japanese Published Patent Application No. 2013-251894

SUMMARY OF THE INVENTION

Patent Document 1 discloses a PLD in which a configuration memory is formed using a nonvolatile memory comprised of a small number of transistors and the area for arranging the configuration memory is reduced; however, it does not sufficiently disclose a PLD in which operation delay is suppressed.

In view of the above-described technical background, an object of one embodiment of the present invention is to provide a novel driving method of a semiconductor device. Another object is to provide a novel semiconductor device that enables a novel driving method of a semiconductor device. More specifically, an object of one embodiment of the present invention is to provide a driving method that suppresses operation delay in a PLD. Another object is to provide a novel PLD in which operation delay can be suppressed.

The objects of one embodiment of the present invention are not limited to the above. The objects described above do not preclude the existence of other objects. The other objects are the ones that are not described above and will be described below. The other objects will be apparent from and can be derived from the description of the specification, the drawings, and the like by those skilled in the art. One embodiment of the present invention is to achieve at least one of the aforementioned objects and the other objects. One embodiment of the present invention need not solve all the aforementioned objects and the other objects.

Furthermore, the object of one embodiment of the present invention can be achieved by a structure different from the structures listed below (for example, structures described later in Embodiments), in some cases. Thus, the present invention need not necessarily include the structures listed below.

One embodiment of the present invention is a novel driving method of a semiconductor device capable of performing dynamic reconfiguration.

Specifically, in one embodiment of the present invention, a period in which a signal input to a circuit that controls conduction between LEs (i.e., an output signal of an LE) is forcibly set to a low level (hereinafter also referred to as Low or "L" level) and a signal at a high level (hereinafter also referred to as High or "H" level) is written to a configuration memory that is subject to rewriting, is provided in a period in which dynamic reconfiguration is performed. After that, the output signal of the LE that has been forcibly set to the "L" level is released and an intended data is written to the configuration memory that is subject to rewriting, whereby the configuration is completed.

In this specification, writing a signal at the "H" level to a configuration memory that is subject to rewriting when a signal input to a circuit that controls conduction between LEs is at the "L" level may be referred to as "performing configuration under favorable conditions".

In contrast to "configuration under favorable conditions", writing a signal at the "H" level to a configuration memory that is subject to rewriting when a signal input to a circuit that controls conduction between LEs is at the "H" level may be referred to as "performing configuration under unfavorable conditions".

One embodiment of the present invention is a driving method of a semiconductor device including a first logic element, a second logic element, and a first circuit having a function of controlling conduction between the first logic element and the second logic element. The first circuit includes a second circuit and a third circuit. The second circuit includes a first transistor, a second transistor, a third transistor, and a first capacitor. One of a source and a drain of the first transistor is electrically connected to a first wiring. The other of the source and the drain of the first transistor is electrically connected to one electrode of the first capacitor and a gate of the second transistor. One of a source and a drain of the second transistor is electrically connected to the first logic element. The other of the source and the drain of the second transistor is electrically connected to one of a source and a drain of the third transistor. The other of the source and the drain of the third transistor is electrically connected to the second logic element. A channel formation region of the first transistor includes an oxide semiconductor. The third circuit includes a fourth transistor, a fifth transistor, a sixth transistor, and a second capacitor. One of a source and a drain of the fourth transistor is electrically connected to the first wiring. The other of the source and the drain of the fourth transistor is electrically connected to one electrode of the second capacitor and a gate of the fifth transistor. One of a source and a drain of the fifth transistor is electrically connected to the first logic element. The other of the source and the drain of the fifth transistor is electrically connected to one of a source and a drain of the sixth transistor. The other of the source and the drain of the sixth transistor is electrically connected to the second logic element. A channel formation region of the fourth transistor includes an oxide semiconductor. The second circuit has a function of storing configuration data that controls conduction between the first logic element and the second logic element. The third circuit has a function of storing configuration data that controls conduction between the first logic element and the second logic element. The driving method of the semiconductor device includes a first period in which conduction between the first logic element and the second logic element is controlled in accordance with configuration data stored in the second circuit. The first period includes a second period in which configuration data is written to the third circuit. The second period includes a third period in which the sixth transistor is turned off and the fourth transistor is turned on. In the third period, an L signal is input to one of the source and the drain of the fifth transistor and an H signal is input to one of the source and the drain of the fourth transistor via the first wiring. In the third period, supply of a clock signal input to the first logic element is stopped.

Furthermore, in the driving method of the semiconductor device of one embodiment of the present invention, the first logic element may include a lookup table, a register, and an AND circuit. The AND circuit may include a first input terminal and a second input terminal. A signal output from the look-up table may be input to the register. A signal output from the register may be input to the first input terminal. In the third period, an L signal may be input to the second input terminal.

One embodiment of the present invention is a driving method of a semiconductor device including a first logic element, a second logic element, a first circuit having a function of controlling conduction between the first logic element and the second logic element, and a fourth circuit. The first circuit includes a second circuit and a third circuit. The second circuit includes a first transistor, a second transistor, a third transistor, and a first capacitor. One of a source and a drain of the first transistor is electrically connected to a first wiring. The other of the source and the drain of the first transistor is electrically connected to one electrode of the first capacitor and a gate of the second transistor. One of a source and a drain of the second transistor is electrically connected to the first logic element. The other of the source and the drain of the second transistor is electrically connected to one of a source and a drain of the third transistor. The other of the source and the drain of the third transistor is electrically connected to the fourth circuit. A channel formation region of the first transistor includes an oxide semiconductor. The third circuit includes a fourth transistor, a fifth transistor, a sixth transistor, and a second capacitor. One of a source and a drain of the fourth transistor is electrically connected to the first wiring. The other of the source and the drain of the fourth transistor is electrically connected to one electrode of the second capacitor and a gate of the fifth transistor. One of a source and a drain of the fifth transistor is electrically connected to the first logic element. The other of the source and the drain of the fifth transistor is electrically connected to one of a source and a drain of the sixth transistor. The other of the source and the drain of the sixth transistor is electrically connected to the fourth circuit. A channel formation region of the fourth transistor includes an oxide semiconductor. The fourth circuit is electrically connected to the second logic element. The fourth circuit includes a seventh transistor and an inverter. One of a source and a drain of the seventh transistor is electrically connected to the other of the source and the drain of the third transistor, the other of the source and the drain of the sixth transistor, and an input terminal of the inverter. The other of the source and the drain of the seventh transistor is electrically connected to a second wiring. A gate of the seventh transistor is electrically connected to an output terminal of the inverter. The input terminal of the inverter is electrically connected to the second logic element. The second circuit has a function of storing configuration data that controls conduction between the first logic element and the second logic element. The third circuit has a function of storing configuration data that controls conduction between the first logic element and the second logic element. The driving method of the semiconductor device includes a first period in which conduction between the first logic element and the second logic element is controlled in accordance with configuration data stored in the second circuit. The first period includes a second period in which configuration data is written to the third circuit. The second period includes a third period in which the sixth transistor is turned off and the fourth transistor is turned on. In the third period, an L signal is input to one of the source and the drain of the fifth transistor and an H signal is input to one of the source and the drain of the fourth transistor via the first wiring. In the third period, the third transistor is turned off.

Furthermore, one embodiment of the present invention is a novel PLD that was obtained in the development of a novel driving method of a PLD capable of performing dynamic reconfiguration.

Specifically, a semiconductor device of one embodiment of the present invention includes a first logic element, a second logic element, a first circuit having a function of controlling conduction between the first logic element and the second logic element, and a fourth circuit. The fourth circuit is electrically connected to the first circuit, and is electrically connected to the second logic element.

More specifically, a semiconductor device of one embodiment of the present invention includes a first logic element, a second logic element, a first circuit, and a fourth circuit. The first circuit has a function of controlling conduction between the first logic element and the fourth circuit. In addition, the first circuit includes a second circuit and a third circuit. The second circuit includes a first transistor, a second transistor, a third transistor, and a first capacitor. One of a source and a drain of the first transistor is electrically connected to a first wiring. The other of the source and the drain of the first transistor is electrically connected to one electrode of the first capacitor and a gate of the second transistor. One of a source and a drain of the second transistor is electrically connected to the fourth transistor. The other of the source and the drain of the second transistor is electrically connected to one of a source and a drain of the third transistor. The other of the source and the drain of the third transistor is electrically connected to the first logic element. The third circuit includes a fourth transistor, a fifth transistor, a sixth transistor, and a second capacitor. One of a source and a drain of the fourth transistor is electrically connected to the first wiring. The other of the source and the drain of the fourth transistor is electrically connected to one electrode of the second capacitor and a gate of the fifth transistor. One of a source and a drain of the fifth transistor is electrically connected to the fourth circuit. The other of the source and the drain of the fifth transistor is electrically connected to one of a source and a drain of the sixth transistor. The other of the source and the drain of the sixth transistor is electrically connected to the first logic element. The fourth circuit is electrically connected to the second logic element.

Furthermore, in the semiconductor device of one embodiment of the present invention, the fourth circuit may include a seventh transistor, an eighth transistor, a ninth transistor, and an inverter. One of a source and a drain of the seventh transistor may be electrically connected to a second wiring. The other of the source and the drain of the seventh transistor may be electrically connected to one of the source and the drain of the second transistor, one of the source and the drain of the fifth transistor, one of a source and a drain of the eighth transistor, one of a source and a drain of the ninth transistor, and an input terminal of the inverter. The other of the source and the drain of the eighth transistor may be electrically connected to a third wiring. A gate of the eighth transistor may be electrically connected to an output terminal of the inverter. The other of the source and the drain of the ninth transistor may be electrically connected to the second logic element. A gate of the ninth transistor may be electrically connected to a fourth wiring.

Furthermore, in the semiconductor device of one embodiment of the present invention, the fourth circuit may have a function of electrically disconnecting the first logic element and the second logic element from each other.

Furthermore, in the semiconductor device of one embodiment of the present invention, the first transistor and the fourth transistor may each include an oxide semiconductor layer.

Furthermore, in the semiconductor device of one embodiment of the present invention, the second wiring may have a function of supplying a first potential to the other of the source and the drain of the seventh transistor. In addition, the third wiring may have a function of supplying a second potential, which is higher than the first potential, to the other of the source and the drain of the eighth transistor. In addition, a period in which the ninth transistor is off may include a period in which the seventh transistor is turned on.

Note that the terms "source" and "drain" of a transistor interchange with each other depending on the type of the channel of the transistor or levels of potentials applied to the electrodes. In general, in a transistor of an n-channel type, an electrode to which a lower potential is applied is called a source, and an electrode to which a higher potential is applied is called a drain. In a transistor of a p-channel type, an electrode to which a low potential is applied is called a drain, and an electrode to which a high potential is applied is called a source. In this specification, although connection relation of the transistor is described assuming that the source and the drain are fixed in some cases for convenience, actually, the names of the source and the drain interchange with each other depending on the relation of the potentials. Therefore, in this specification, a source and a drain are not particularly specified and are referred to as a first electrode (or a first terminal) and a second electrode (or a second terminal) in some cases. For example, when the first electrode is a source, the second electrode refers to a drain, whereas when the first electrode is a drain, the second electrode refers to a source.

Furthermore, the expression "A and B are connected" in this specification includes the case where A and B are electrically connected (i.e., A and B are connected through another element or another circuit between A and B) and the case where A and B are directly connected (i.e., A and B are connected without another element or another circuit between A and B). In addition, to be "electrically connected" can be regarded as to form a circuit structure in which current, voltage, or a potential can be supplied or transmitted, and therefore also includes in its category to form a circuit structure in which components are indirectly connected through a circuit element such as a wiring, a resistor, a diode, or a transistor such that current, voltage, or a potential can be supplied or transmitted.

In this specification and drawings, expressions such as a potential "VDD" and a potential "VSS" may be used. VDD refers to a potential higher than a reference potential (i.e., high potential), and VSS refers to a potential lower than the reference potential (i.e., low potential). Note that the reference potential can be set to a given value.

According to one embodiment of the present invention, a novel semiconductor device and a method for driving the semiconductor device can be provided.

Furthermore, according to one embodiment of the present invention, operation delay in a PLD can be suppressed in such a manner that a boosting effect of a charge retention node due to capacitive coupling is utilized when dynamic reconfiguration is performed.

Furthermore, according to one embodiment of the present invention, there is no need to monitor whether or not configuration under favorable conditions is performed.

Furthermore, according to one embodiment of the present invention, a novel PLD in which operation delay can be suppressed can be provided.

BRIEF DESCRIPTION OF THE DRAWINGS

In the accompanying drawings:

FIGS. 10A to 10C show an example of a structure of a semiconductor device;

DETAILED DESCRIPTION OF THE INVENTION

Figure 1:
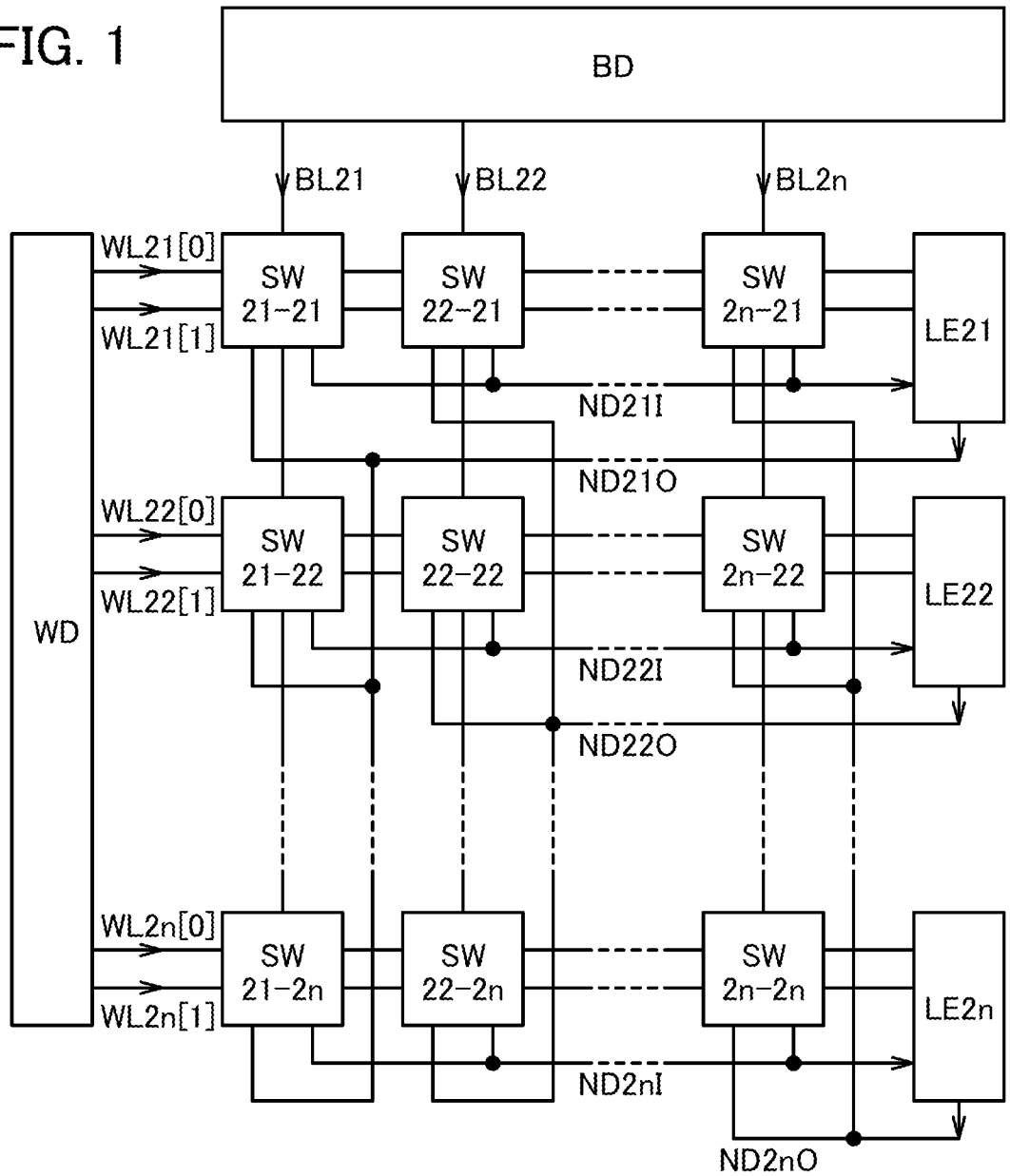
FIG. 1 shows an example of a structure of a semiconductor device.

Embodiments and an example of one embodiment of the present invention will be described in detail with reference to the drawings. However, the present invention is not limited to the description below, and it is easily understood by those skilled in the art that modes and details can be modified in various ways without departing from the spirit and scope of the present invention. Therefore, the present invention should not be construed as being limited to the description of the embodiments and the example. Note that in the modes of the present invention to be described below, the same reference numerals are used to denote the same components in different drawings.

Furthermore, the embodiments and examples described below can be implemented by being combined with any of the other embodiments and examples described in this specification unless otherwise mentioned.

Embodiment 1

A semiconductor device and a driving method thereof that are embodiments of the present invention will be described with reference to FIGS. 1 to 4.

FIG. 1 shows a circuit structure of a semiconductor device of one embodiment of the present invention.

The PLD shown in FIG. 1 includes n (n is an integer of 2 or more) logic elements LE (logic elements LE21 to LE2*n*), $n^2$ circuits SW (circuits SW21-21 to SW2*n*-2*n*), a bit driver BD, and a word driver WD.

The logic element LE includes a configuration memory inside, and has a function of outputting a specific output signal with respect to an input signal, in accordance with configuration data stored in the configuration memory.

The circuit SW has a function of controlling conduction between the logic elements LE. The circuit SW can be expressed as a "switch", because of the nature of its function. Although a structure in FIG. 1 has $n^2$ circuits SW with respect to n logic elements LE, the present invention is not limited thereto. That is, as long as there is no need for each of the logic elements LE to be in conduction with all the n logic elements LE including itself, a structure including less than $n^2$ circuits SW may be employed. For example, if it is acceptable as long as each logic element LE is in conduction with m (m is an integer of for more and less than n) circuits SW, a structure including m×n circuits SW may be employed.

The bit driver BD and the word driver WD have a function of controlling the configuration of the logic elements LE and the circuits SW, and are capable of storing configuration data corresponding to potentials of signal lines BL21 to BL2*n* in the configuration memory selected by a signal line WL.

In the structure shown in FIG. 1, the circuit SW can perform configuration by writing configuration data corresponding to a potential of the signal line BL to the configuration memory selected by one of the two kinds of signal lines WL. For example, the circuit SW21-22 can perform configuration by writing configuration data corresponding to the potential of the signal line BL21 to the configuration memory selected by the two kinds of signal lines WL (WL22[0] or WL22[1]).

Figure 2:
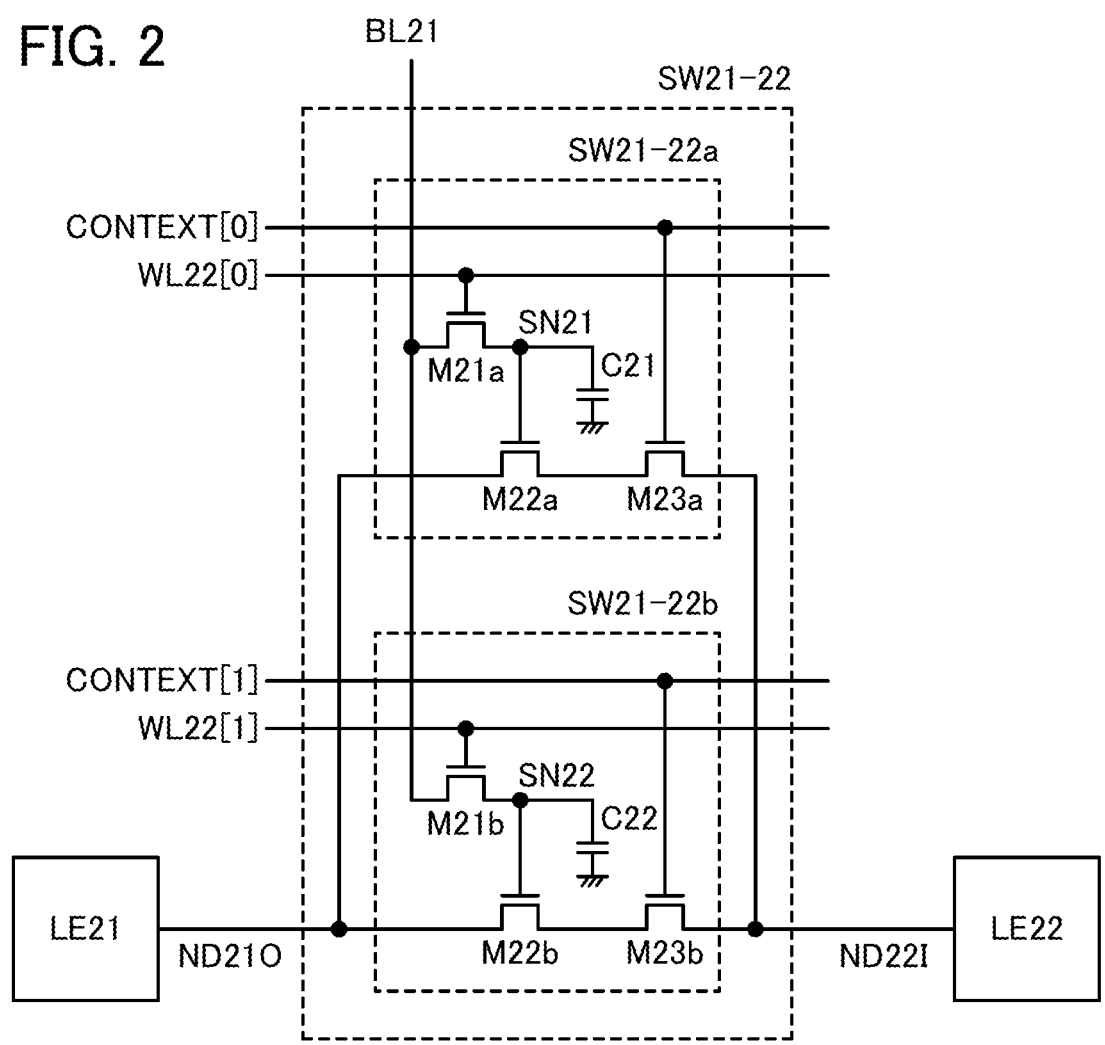
FIG. 2 shows an example of a structure of a semiconductor device.

FIG. 2 shows a circuit structure of the circuit SW21-22. Although the circuit SW21-22 in FIG. 1 will be explained as a typical example here, the other circuits SW can also be similarly explained.

The circuit SW21-22 includes a circuit SW21-22*a* and a circuit SW21-22*b*, and has a function of controlling conduction between the logic element LE21 and the logic element LE22 (in other words, a function of selecting conduction or non-conduction between the logic element LE21 and the logic element LE22).

The circuit SW21-22*a* (the circuit 21-22*b*) includes a transistor M21*a* (a transistor M21*b*), a transistor M22*a* (a transistor M22*b*), a transistor M23*a* (a transistor M23*b*), and a capacitor C21 (a capacitor C22). The circuit SW21-22*a* (the circuit SW21-22*b*) writes configuration data that corresponds to the signal line BL21 to the capacitor C21 (the capacitor C22) when the transistor M21*a* (the transistor M21*b*) is turned on by the signal line WL22[0] (the signal line WL22[1]). Then, in accordance with the configuration data stored in a node SN21 (a node SN22), conduction or non-conduction of the transistor M22*a* (the transistor M22*b*) is controlled. Furthermore, conduction or non-conduction of the transistor M23*a* (the transistor M23*b*) is controlled by a signal CONTEXT[0] (a signal CONTEXT[1]), whereby the circuit SW21-22*a* (the circuit SW21-22*b*) can control the conduction between the logic element LE21 and the logic element LE22. Furthermore, one of a source and a drain of the transistor M22*a* (the transistor M22*b*) is electrically connected to the logic element LE21 via a wiring that supplies a potential of a node ND21O, and one of a source and a drain of the transistor M23*a* (the transistor M23*b*) is electrically connected to the logic element LE22 via a wiring that supplies a potential of a node ND22I.

Note that the circuit SW can behave as a configuration memory by holding potentials of the node SN21 and the node SN22. Therefore, a transistor with extremely low off-state current is preferably used as each of the transistor M21*a* and the transistor M21*b*. Specifically, a transistor including an oxide semiconductor in its channel formation region is preferably used.

Figure 3:
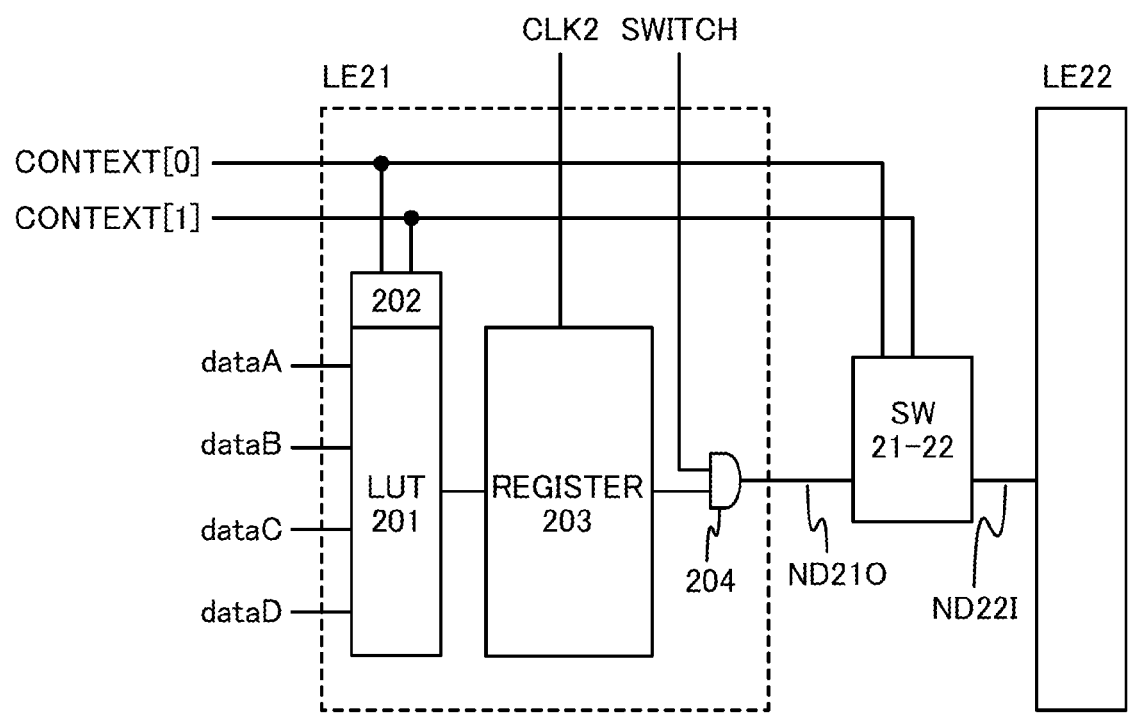
FIG. 3 shows an example of a structure of a semiconductor device.

FIG. 3 shows a circuit structure of the logic element LE21. Although the logic element LE21 in FIG. 1 will be explained as a typical example here, the other logic elements LE can also be similarly explained.

The logic element LE21 includes a lookup table 201 (hereinafter also referred to as "LUT" in this specification), a memory device 202, a register 203 (hereinafter also referred to as "REGISTER" in this specification), and an AND circuit 204.

The lookup table 201 has a function of outputting a specific value in response to four signals (dataA, dataB, dataC, or dataD) input via wirings, in accordance with a truth table set in the memory device 202. Although the lookup table 201 is explained here to have a function of outputting a specific output value that corresponds to the four signals, the present invention is not limited thereto. That is, the number of signals input to the lookup table 201 is not limited to four, and may be k (k is an integer of 1 or more). In addition, the truth table can be set freely by inputting the signal CONTEXT[0] or the signal CONTEXT[1] to the memory device 202.

The register 203 has a function of holding an output value from the lookup table 201. Furthermore, the value held in the register 203 changes in synchronization with a clock signal CLK2. The AND circuit 204 has a function of outputting AND of the output of the register 203 and a signal SWITCH input via a wiring. That is, when the signal SWITCH is at the "L" level, the output of the AND circuit 204 becomes a potential at the "L" level, regardless of the output of the register 203. Furthermore, when the signal SWITCH is at the "H" level, the output value of the register 203 is output as it is as the output of the AND circuit 204. In this manner, by setting the signal SWITCH at the "L" level, the output of the logic element can be forcibly set to the "L" level.

The circuit SW21-22 has a function of controlling conduction between the logic element LE21 and the logic element LE22. Furthermore, the circuit SW21-22 has a function of receiving a signal input from the logic element LE21 and outputting the signal to the logic element LE22. In addition, the circuit SW21-22 receives the signal CONTEXT[0] and the signal CONTEXT[1] input via wirings, and through the control of the signal CONTEXT[0] and the signal CONTEXT[1], the circuit structure based on the first configuration data set (i.e., the circuit SW21-22a) and the circuit structure based on the second configuration data set (i.e., the circuit SW21-22b) can be instantaneously switched.

Figure 4:
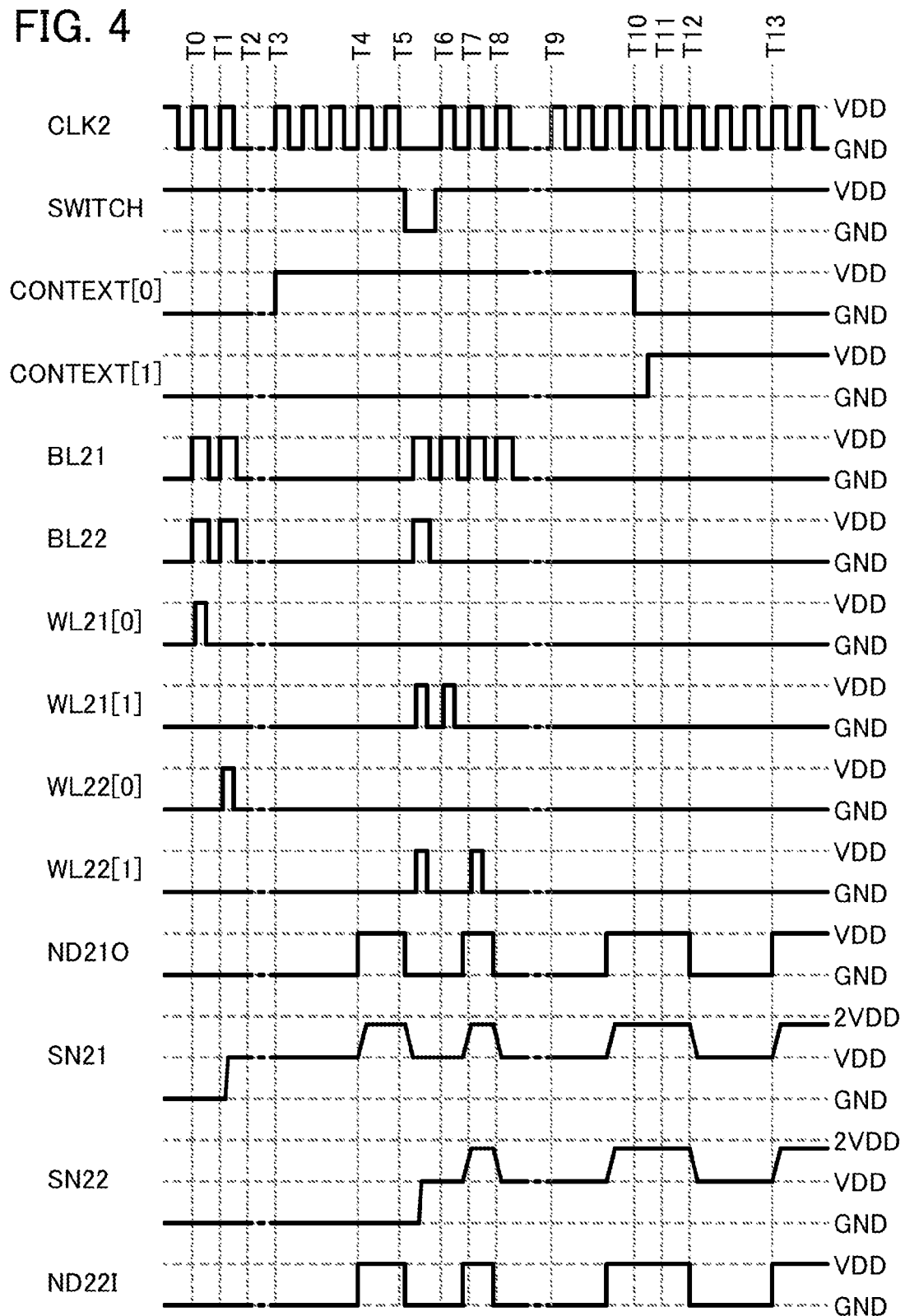
FIG. 4 is timing chart of an example of a driving method of a semiconductor device.

FIG. 4 is a timing chart of the circuits shown in FIGS. 1 to 3.

The timing chart shown in FIG. 4 assumes the case where configuration of the first configuration data set is performed on the circuit SW21-22a in FIG. 2, and then, while the semiconductor device (chip) operates with the circuit structure based on the first configuration data set, dynamic reconfiguration of the second configuration data set is performed on the circuit SW21-22b in FIG. 2. However, since the circuit SW21-22a and the circuit SW21-22b have the same structure, they can be operated similarly in the opposite case.

In FIG. 4, during a period from a time T0 to a time T3, an initial configuration is performed on the first configuration data set. First, during a period from the time T0 to a time T1, that is, during a period in which a potential of the node ND21O which corresponds to a signal input to the circuit SW21-22 (a potential of a wiring electrically connecting the logic element LE21 to one of the source and the drain of the transistor M22a (M22b)) is at the "L" level, a signal at the "H" level is supplied to the signal line WL21[0] and a signal at the "H" level is supplied to the signal line BL21, whereby configuration under favorable conditions is performed on a circuit SW21-21a. Next, during a period from the time T1 to a time T2, that is, during a period in which the potential of the node ND21O is at the "L" level, a signal at the "H" level is supplied to the signal line WL22[0] and a signal at the "H" level is supplied to the signal line BL21, whereby configuration data corresponding to the "H" level is written to the capacitor C21. After that, a signal at the "L" level is supplied to the signal line WL22[0] and a signal at the "L" level is supplied to the signal line BL21 so that the transistor M21a is turned off, whereby configuration data of the node SN21 is stored. Thus, configuration under favorable conditions is performed on the circuit SW21-22a. Lastly, during a period from the time T2 to the time T3, desired configuration data is written to the other configuration memories.

At the time T3, the signal CONTEXT[0] is set to the "H" level, whereby the transistor M23a is turned on. At a time T4, the potential of the node ND21O is changed from the "L" level to the "H" level, whereby the potential of the node SN21 is boosted because of the capacitive coupling via the gate capacitance of the transistor M22a. Therefore, a potential of the node ND22I is immediately set to the "H" level. That is, the signal-transmission speed between the logic element LE21 and the logic element LE22 via the circuit SW21-22 improves.

Next, during a period from a time T5 to a time T9, dynamic reconfiguration of the second configuration data set is performed. First, at the time T5, supply of the clock signal CLK2 input to the register 203 is stopped. After that, by setting a signal SWITCH input to the AND circuit 204 to the "L" level, output of the logic element LE21 (the potential of the node ND21O) is forcibly set to the "L" level. Next, the signal line WL22 [1] is set to the "H" level, and a signal at the "H" level is written to the node SN22 via the signal line BL21. By using such a driving method during a period from the time T5 to a time T6, configuration under favorable conditions can be performed on the circuit SW21-22b. Note that at the timing when configuration under favorable conditions is performed on the circuits SW, the configuration is performed not only on the circuit SW21-22b but also on all the circuits SW that correspond to the second configuration data set (i.e., $n^2$ circuits SW including the circuits SW21-21b to SW2n-2nb) at a time. For this reason, configuration under favorable conditions can be performed in an extremely short time, as compared to a period in which correct configuration data is written to all the circuits SW that correspond to the second configuration data set (a period from the time T6 to the time T9).

Here, there seems to be concern that the data of the logic element LE22 which is an output destination of the circuit SW21-22 is changed because of the potential of the node ND21O that is forcibly set to the "L" level during the period from the time T5 to the time T6. However, in this embodiment, data of the logic element LE22 is prevented from being changed during the period from the time T5 to the time T6, through stopping the supply of the clock signal CLK2 input to the register 203. Accordingly, an unintended logic operation of the logic element LE22 (a malfunction of the logic element LE22) caused by data variation can be prevented.

Next, during the period from the time T6 to the time T9, correct configuration data is written to all the circuits SW that correspond to the second configuration data set. First, during a period from the time T6 to a time T7, a signal at the "H" level is supplied to the signal line WL21[1], and correct configuration data is written to configuration memories of the circuits SW21-21b to SW2n-21b via the signal lines BL21 to BL2n. For example, in FIG. 4, a signal at the "H" level is stored in the configuration memory of the circuit SW21-21b and a signal at the "L" level is stored in the configuration memory of the circuit SW22-21b.

During a period from the time T7 to a time T8, a signal at the "H" level is supplied to the signal line WL22[1], and correct configuration data is written to configuration memories of the circuits SW21-22b to SW2n-22b via the signal lines BL21 to BL2n. For example, in FIG. 4, a signal at the "H" level is stored in the configuration memory of the circuit SW21-22b and a signal at the "L" level is stored in the configuration memory of the circuit SW22-22b.

Focusing on the circuit SW21-22b here, during the period from the time T7 to the time T8, that is, when the potential of the node ND21O is at the "H" level, a signal at the "H" level is supplied to the signal line WL22[1] and a signal at the "H" level is supplied to the signal line BL21. In other words, configuration under unfavorable conditions is performed. However, in this embodiment, configuration under favorable conditions is performed during the period from the time T5 to the time T6, and the potential of the node SN22 is VDD. Then, during the period from the time T6 to the time T7, when the potential of the node ND21O is switched from the "L" level to the "H" level, the potential of the node SN22 is boosted to approximately 2VDD, for example, because of the capacitive coupling via the gate capacitance of the transistor M22b. That is, during the period from the time T7 to the time T8, a signal at the "H" level is supplied to the gate and a signal at the "H" level is supplied to the source of the transistor M21b via the signal line WL22[1] and the signal line BL21, respectively. Accordingly, the gate-source voltage becomes 0 V and the transistor M21b is turned off, so that the boosted potential (e.g., a potential of approximately 2VDD) can be kept as the potential of the node SN22. As a result, the signal-transmission speed via the circuit SW21-22b remains in the improved state, and operation delay of the circuit SW21-22b can be suppressed.

During a period from the time T8 to the time T9, desired configuration data is written to the other configuration memories in a manner similar to those in the period from the time T6 to the time T7 and the period from the time T7 to the time T8.

Next, during a period from a time T10 to a time T11, the configuration data set to be selected is switched. That is, at the time T10, the signal CONTEXT[0] is set to the "L" level, and then the signal CONTEXT[1] is set to the "H" level, whereby the second configuration data set is selected.

At a time T12, the potential of the node ND21O is changed from the "H" level to the "L" level. At this time, although the potential of the node SN22 is stepped down to VDD because of the capacitive coupling via the gate capacitance of the transistor M22b, the gate-source voltage of the transistor M22b is VDD; thus, the potential of the node ND22I is immediately set to the "L" level.

At a time T13, the potential of the node ND21O is changed from the "L" level to the "H" level. At this time, the potential of the node SN22 is boosted because of the capacitive coupling via the gate capacitance of the transistor M22b. Therefore, the potential of the node ND22I is immediately set to the "H" level. That is, the speed of signal-transmission between the node ND21O and the node ND22I via the circuit SW21-22b improves.

As described above, a feature of the driving method of a semiconductor device described in this embodiment is, in the case where dynamic reconfiguration of the second configuration memories is performed while the semiconductor device (chip) operates with the circuit structure based on the configuration data held in the first configuration memories, a period in which configuration under favorable conditions is performed (a period in which configuration data under favorable conditions is written) on all the second configuration memories is provided separately from a period in which correct configuration data is written to the second configuration memories. By employing such a driving method, reduction in operation speed of the circuit SW can be suppressed, regardless of the conditions under which correct configuration data is written.

Embodiment 2

A semiconductor device and a driving method that are embodiments of the present invention will be described with reference to FIG. 2, FIG. 3, and FIGS. 5 to 7.

The driving method of a semiconductor device described in this embodiment is the same as the driving method described in Embodiment 1 in that a period in which configuration under favorable conditions is performed is provided. However, the driving method of a semiconductor device described in this embodiment is different from the driving method described in Embodiment 1 in the method of preventing a malfunction caused by data variation of a logic element LE, which should be taken into account when configuration under favorable conditions is performed. Accordingly, this point in particular will be described in detail.

Figure 5:
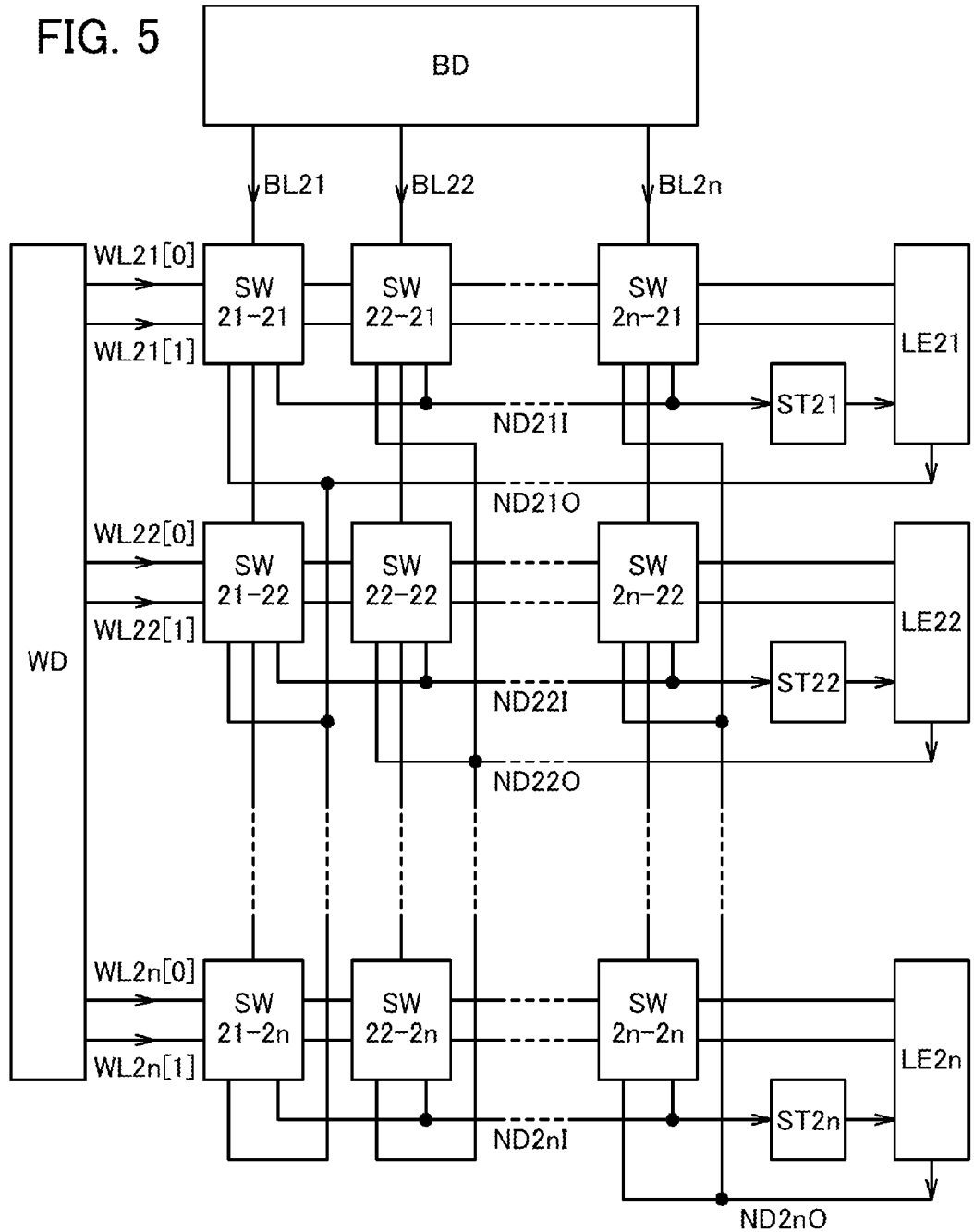
FIG. 5 shows an example of a structure of a semiconductor device.

FIG. 5 shows a circuit structure of a PLD according to one embodiment of the present invention.

The circuit shown in FIG. 5 is different from the circuit shown in FIG. 1 in that it includes circuits ST21 to ST2n (n is an integer of 2 or more); however, the other components included therein are the same as those shown in FIG. 1. Therefore, description of the same portions will be omitted.

The circuit ST2n is provided between circuits SW21-2n to SW2n-2n and a logic element LE2n. That is, the circuit ST2n is electrically connected to the circuits SW21-2n to SW2n-2n, and is electrically connected to the logic element LE2n. In addition, the circuit ST2n has a function of receiving a signal input from the circuits SW21-2n to SW2n-2n, and outputting a signal to the logic element LE2n. Furthermore, the circuit ST2n has a function of holding a signal (data) output from the circuits SW21-2n to SW2n-2n.

Figure 6:
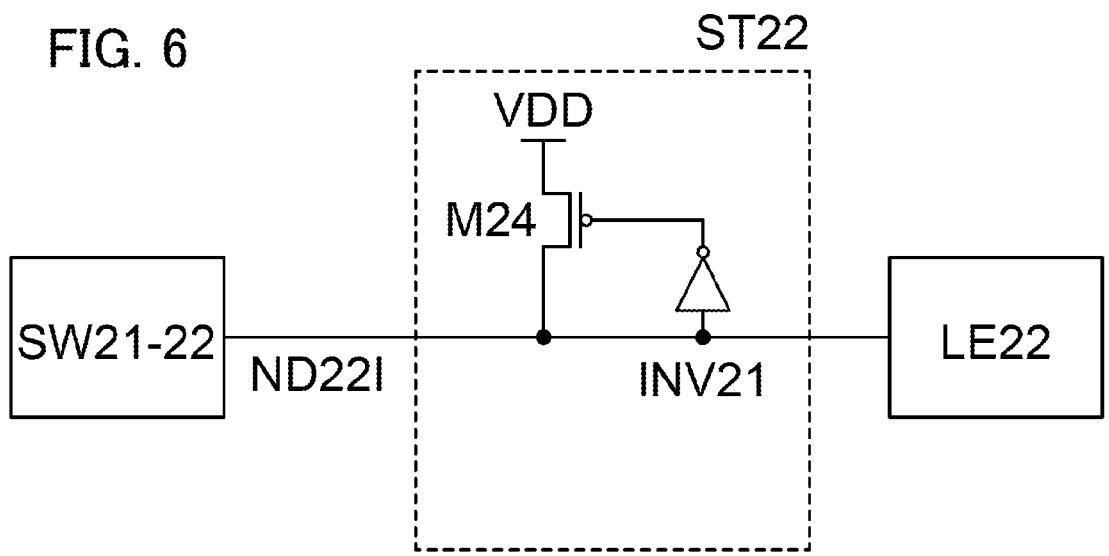
FIG. 6 shows an example of a structure of a semiconductor device.

FIG. 6 shows an example of a specific circuit structure of a circuit ST22 according to one embodiment of the present invention.

The circuit ST22 includes a transistor M24 and an inverter 21. One of a source and a drain of the transistor M24 is electrically connected to the circuit SW21-22 and an input terminal of the inverter 21. The other of the source and the drain of the transistor M24 is electrically connected to a wiring. A gate of the transistor M24 is electrically connected to an output terminal of the inverter 21. The input terminal of the inverter 21 is electrically connected to the logic element LE22. In addition, a potential higher than a reference potential (high potential or VDD) is supplied to the wiring that is electrically connected to the other of the source and the drain of the transistor M24. Note that although circuits SW22-22 to SW2n-22 are also connected to the node ND22I, they are not shown in FIG. 6.

Figure 7:
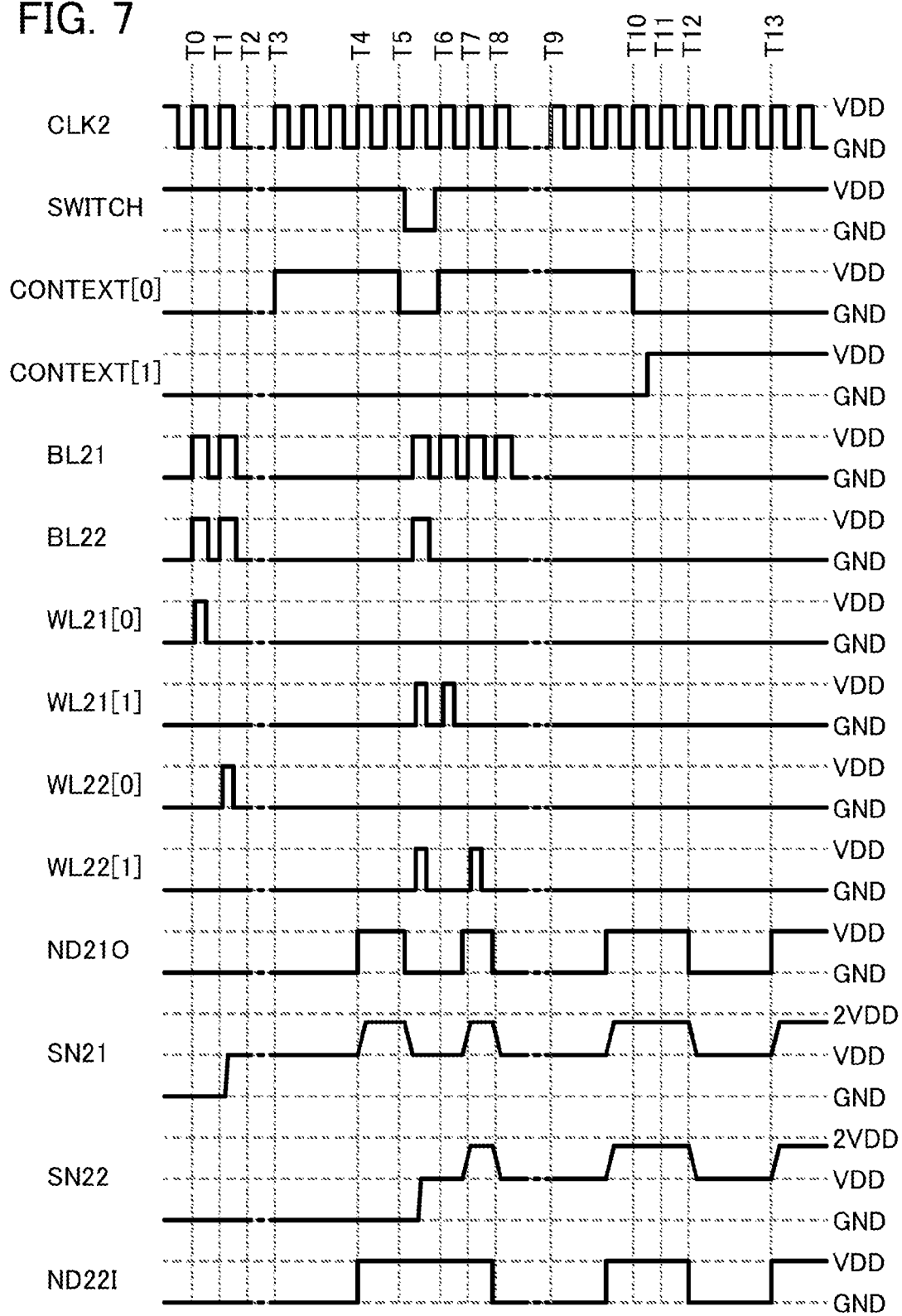
FIG. 7 is a timing chart of an example of a driving method of a semiconductor device.

FIG. 7 is a timing chart of the circuits shown in FIGS. 2, 3, 5, and 6.

As with Embodiment 1, the timing chart shown in FIG. 7 assumes the case where configuration of the first configuration data set is performed on the circuit SW21-22a in FIG. 2, and then, while the semiconductor device (chip) operates with the circuit structure based on the first configuration data set, dynamic reconfiguration of the second configuration data set is performed on the circuit SW21-22b in FIG. 2.

When the timing chart shown in FIG. 7 is compared with the timing chart described in Embodiment 1 with reference to FIG. 4, the operations during a period from a time T5 to a time T6 are different from each other, but the operations in the other periods are similar to each other. Accordingly, only the operation during the period from the time T5 to the time T6 will be described here. For the operation in the other periods, the description in Embodiment 1 is referred to.

The period from the time T5 to the time T6 corresponds to a period in which configuration under favorable conditions is performed on all the circuits SW. First, at the time T5, the signal CONTEXT[0] is set to the "L" level to turn off the transistor M23a. After that, by setting the signal SWITCH input to the AND circuit 204 shown in FIG. 3 to the "L" level, an output of the logic element LE21 (the potential of the node ND21O) is forcibly set to the "L" level. Next, the signal line WL22[1] is set to the "H" level, and a signal at the "H" level is written to the node SN22 via the signal line BL21.

According to this embodiment, since the circuit ST22 is provided as the output destination of the circuit SW21-22a, the output data of the circuit SW21-22a can be held even when the transistor M23a is turned off. Therefore, during the period from the time T5 to the time T6 including a period in which the potential of the node ND21O is forcibly set to the "L" level, an unintended logic operation of the logic element LE22 (a malfunction of the logic element LE22) can be prevented.

Next, at the time T6, after the signal CONTEXT[0] is set to the "H" level, correct configuration data is written to all the circuits SW. For the operation after the time T6, the description in Embodiment 1 is referred to.

As described above, in the driving method of a semiconductor device described in this embodiment, the signal CONTEXT[0] is set to the "L" level during a period in which configuration under favorable conditions is performed, and the circuit ST22 is provided between the output destination of the circuit SW21-22 and the logic element LE22; thus, an unintended logic operation of the logic element LE22 (a malfunction of the logic element LE22) can be prevented.

Embodiment 3

A semiconductor device and a driving method that are embodiments of the present invention will be described with reference to FIGS. 13 to 16.

Figure 13:
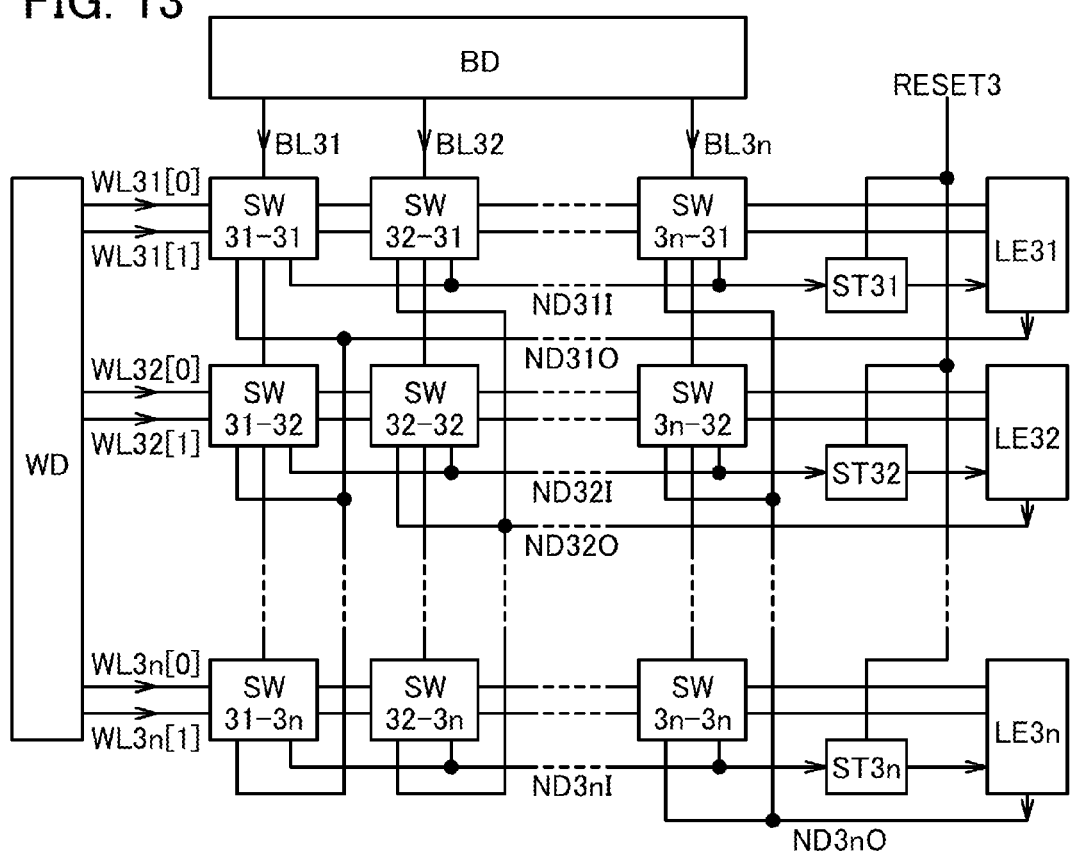
FIG. 13 shows an example of a structure of a semiconductor device.

FIG. 13 shows a circuit structure of a semiconductor device according to one embodiment of the present invention.

The PLD shown in FIG. 13 includes n (n is an integer of 2 or more) logic elements LE (logic elements LE31 to LE3n), $n^2$ circuits SW (circuits SW31-31 to SW3n-3n), a bit driver BD, a word driver WD, and n circuits ST (circuits ST31 to ST3n).

The logic element LE includes a configuration memory inside, and has a function of outputting a specific output signal with respect to an input signal, in accordance with configuration data stored in the configuration memory.

The circuit SW has a function of controlling conduction between the logic elements LE. The circuit SW can be expressed as a "switch", because of the nature of its function. Although a structure in FIG. 13 has $n^2$ circuits SW with respect to n logic elements LE, the present invention is not limited thereto. That is, as long as there is no need for each of the logic elements LE to be in conduction with all the n logic elements LE including itself, a structure including less than $n^2$ circuits SW may be employed. For example, if it is acceptable as long as each logic element LE is in conduction with m (m is an integer of 1 or more and less than n) circuits SW, a structure including m×n circuits SW may be employed.

The bit driver BD and the word driver WD have a function of controlling the configuration of the logic elements LE and the circuits SW, and are capable of storing configuration data corresponding to potentials of signal lines BL31 to BL3n in the configuration memory selected by a signal line WL.

The circuit ST has a function of forcibly setting the potentials of nodes ND31I to ND3nI to the "L" level. That is, the circuit ST has a function of turning off the conduction between two logic elements. The circuit ST can be expressed as a "reset circuit", because of the nature of its function.

In the structure shown in FIG. 13, the circuit SW can perform configuration by writing configuration data corresponding to a potential of the signal line BL to the configuration memory selected by one of the two kinds of signal lines WL. For example, the circuit SW31-32 can perform configuration by writing the configuration data corresponding to the potential of the signal line BL31 to the configuration memory selected by the two kinds of signal lines WL (WL32[0] or WL32[1]).

Figure 14:
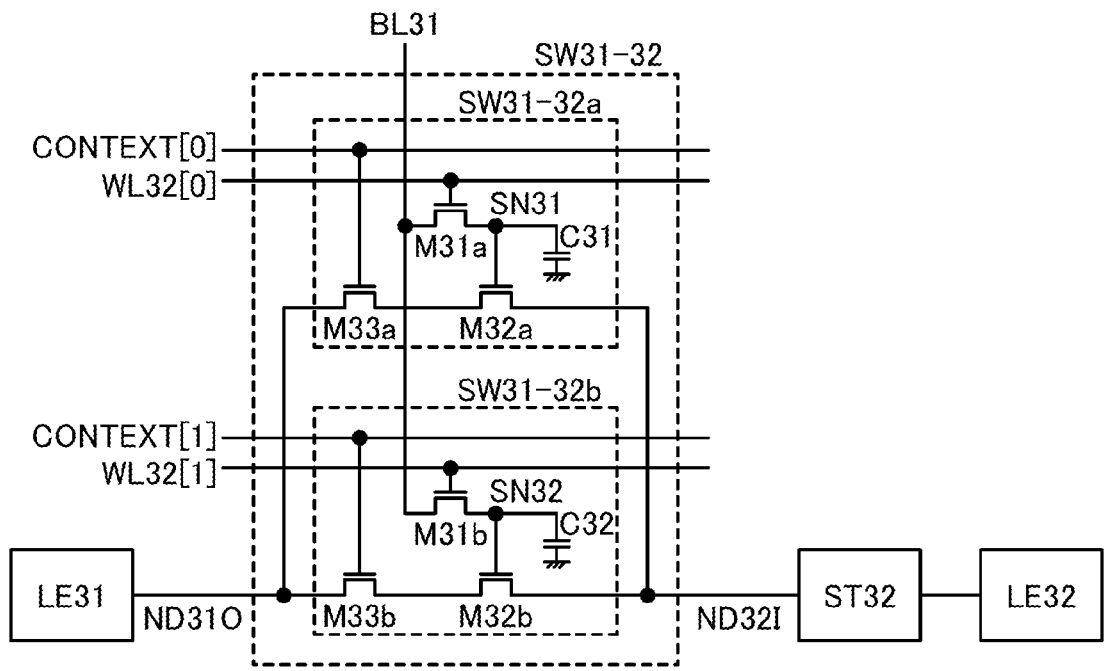
FIG. 14 shows an example of a structure of a semiconductor device.

FIG. 14 shows a circuit structure of the circuit SW31-32. Although the circuit SW31-32 in FIG. 13 will be explained as a typical example here, the other circuits SW can also be similarly explained.

The circuit SW31-32 includes a circuit SW31-32a and a circuit SW31-32b, and has a function of controlling conduction between the logic element LE31 and the circuit ST32 (in other words, a function of selecting conduction or non-conduction between the logic element LE31 and the circuit ST32).

The circuit SW31-32a (the circuit SW31-32b) includes a transistor M31a (a transistor M31b), a transistor M32a (a transistor M32b), a transistor M33a (a transistor M33b), and a capacitor C31 (a capacitor C32). The circuit SW31-32a (the circuit SW31-32b) writes configuration data that corresponds to the signal line BL31 to the capacitor C31 (the capacitor C32) when the transistor M31a (the transistor M31b) is turned on by the signal line WL32[0] (the signal line WL32[1]). Then, in accordance with the configuration data stored in a node SN31 (a node SN32), conduction or non-conduction of the transistor M32a (the transistor M32b) is controlled. One of a source and a drain of the transistor M32a (the transistor M32b) is electrically connected to the circuit ST32 via a node ND32I (a wiring), and the circuit ST32 is electrically connected to the logic element LE32. The other of the source and the drain of the transistor M32a (the transistor M32b) is electrically connected to one of a source and a drain of the transistor M33a (the transistor M33b), and the other of the source and the drain of the transistor M33a (the transistor M33b) is electrically connected to the logic element LE31 via a node ND31O (a wiring). Furthermore, conduction or non-conduction of the transistor M33a (the transistor M33b) is controlled by a signal CONTEXT[0] (a signal CONTEXT[1]) supplied to the gate via a wiring, whereby the circuit SW31-32a (the circuit SW31-32b) can control the conduction between the logic element LE31 and the circuit ST32.

Note that the circuit SW can behave as a configuration memory by holding potentials of the node SN31 and the node SN32. Therefore, a transistor with extremely low off-state current is preferably used as each of the transistor M31a and the transistor M31b. Specifically, a transistor including an oxide semiconductor in its channel formation region is preferably used.

Figure 15:
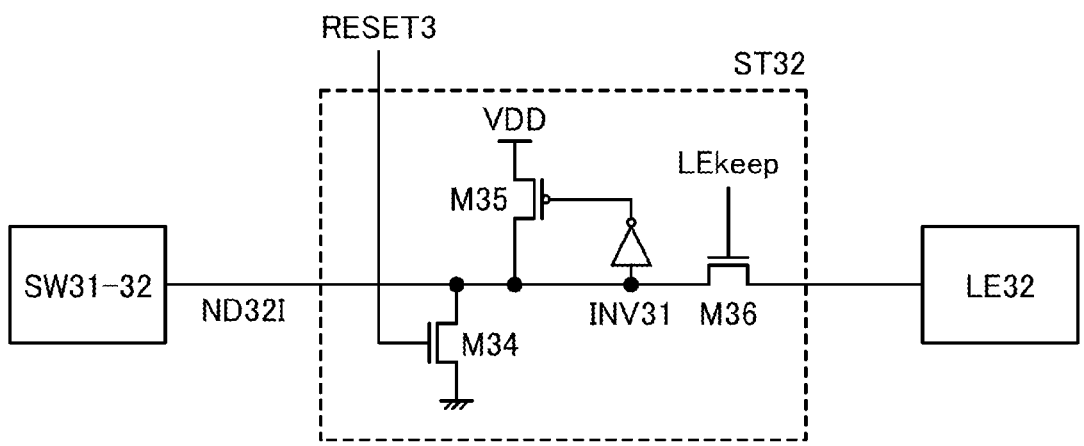
FIG. 15 shows an example of a structure of a semiconductor device.

FIG. 15 shows a circuit structure of the circuit ST32. Although the circuit ST32 in FIG. 13 will be explained as a typical example here, the other circuits ST can also be similarly explained.

The circuit ST32 includes a transistor M34, a transistor M35, a transistor M36, and an inverter INV31. In addition, the circuit ST32 has a function of stabilizing the potential of the node ND32I at the "H" level or resetting the potential of the node ND32I to the "L" level. Here, in the case where the potential of the node ND32I is at the "H" level, VDD that corresponds to a potential at the "H" level is supplied to the node ND32I via the inverter INV31 and the transistor M35, whereby the potential at the "H" level can be held (stabilized). In addition, when the potential of the node ND32I is desired to be forcibly set to the "L" level, a potential at the "H" level is supplied to a signal line RESET3 to turn on the transistor M34, whereby the potential of the node ND32I can be forcibly set to the "L" level. Furthermore, by supplying a potential at the "L" level to a signal line LEkeep to turn off the transistor M36, change of data in the logic element LE32 can be suppressed.

Figure 16:
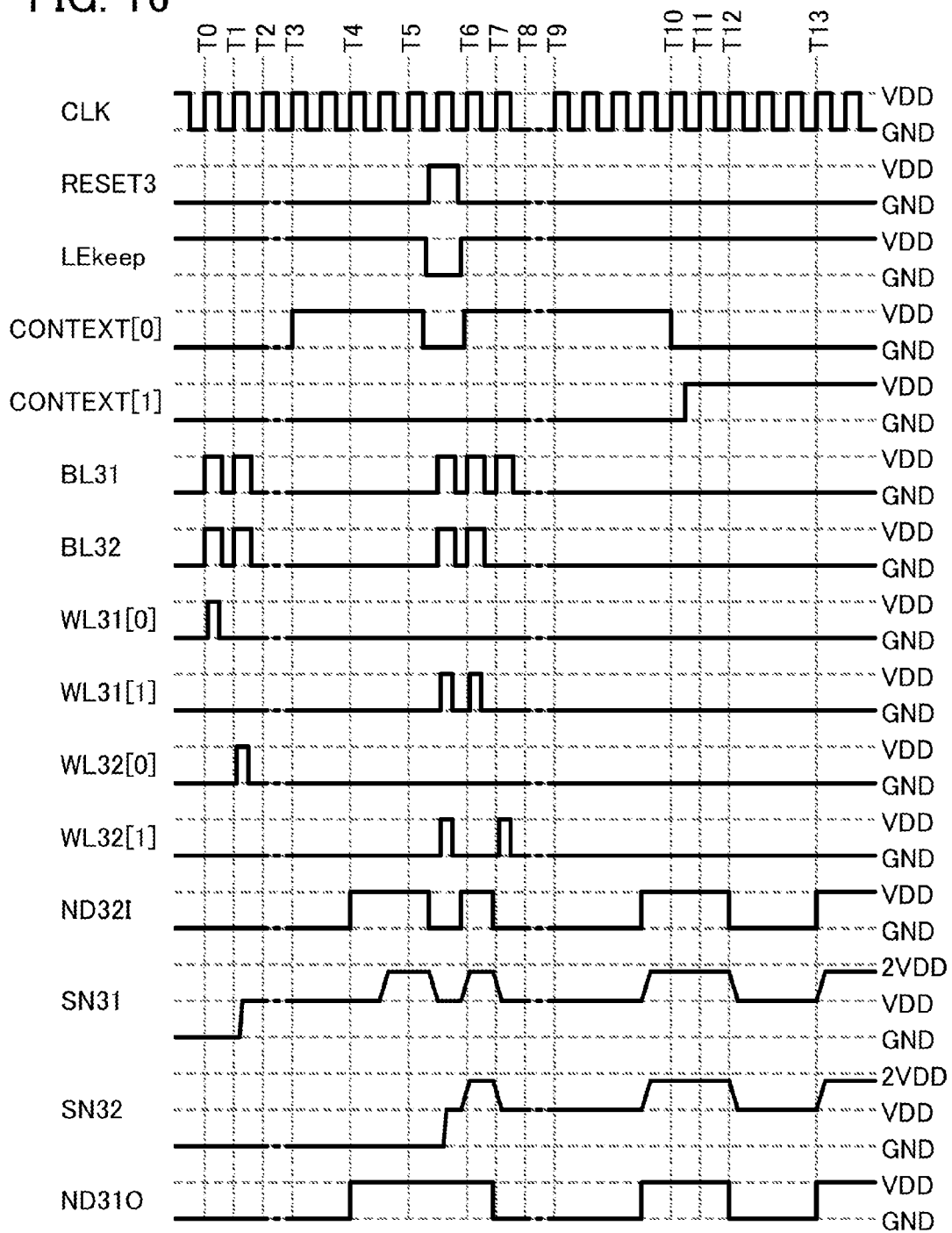
FIG. 16 is a timing chart of an example of a driving method of a semiconductor device.

FIG. 16 is a timing chart of the circuits shown in FIGS. 13 to 15.

The timing chart shown in FIG. 16 assumes the case where configuration of the first configuration data set is performed on the circuit SW31-32a in FIG. 14, and then, while the semiconductor device (chip) operates (is active) with the circuit structure based on the first configuration data set, dynamic reconfiguration of the second configuration data set is performed on the circuit SW31-32b in FIG. 14. However, since the circuit SW31-32a and the circuit SW31-32b have the same structure, they can be operated similarly in the reverse case.

In FIG. 16, during a period from a time T0 to a time T3, initial configuration is performed on the first configuration data set. First, during a period from the time T0 to a time T1, that is, during a period in which a potential of the node ND32I which corresponds to an input signal of the circuit SW31-32 (a potential of a wiring electrically connecting the circuit ST32 to one of the source and the drain of the transistor M32a (the transistor M32b)) is at the "L" level, a signal at the "H" level is supplied to the signal line WL31[0] and a signal at the "H" level is supplied to the signal line BL31, whereby configuration under favorable conditions is performed on a circuit SW31-31a. Next, during a period from the time T1 to a time T2, that is, during a period in which the potential of the node ND32I is at the "L" level, a signal at the "H" level is supplied to the signal line WL32[0] and a signal at the "H" level is supplied to the signal line BL31, whereby configuration data corresponding to an "H" level is written to the capacitor C31. After that, a signal at the "L" level is supplied to the signal line WL32[0] and a signal at the "L" level is supplied to the signal line BL31 so that the transistor M31a is turned off, whereby configuration data of the node SN31 is stored. Thus, configuration under favorable conditions is performed on the circuit SW31-32a. Lastly, during a period from the time T2 to the time T3, desired configuration data is written to the other configuration memories.

At the time T3, the potential of a signal CONTEXT[0] is set to the "H" level, whereby the transistor M33a is turned on. At a time T4, the potential of the node ND31O is changed from the "L" level to the "H" level, whereby the potential of the node SN31 is boosted because of the capacitive coupling via the gate capacitance of the transistor M32a. Therefore, the potential of the node ND32I is immediately set to the "H" level. That is, the signal-transmission speed between the logic element LE31 and the logic element LE32 via the circuit SW31-32 improves.

Next, during a period from a time T5 to a time T9, dynamic reconfiguration of the second configuration data set is performed. First, during a period from the time T5 to a time T6, the signal CONTEXT[0] is set to the "L" level. In addition the potential of the signal line LEkeep is set to the "L" level and the potential of the signal line RESET3 is set to the "H" level, whereby the potential of the node ND32I can be forcibly set to the "L" level. Next, the signal line WL32[1] is set to the "H" level, and a signal at the "H" level is written to the node SN32 via the signal line BL31. By using such a driving method, configuration under favorable conditions can be performed on the circuit SW31-32b. Note that at the timing when configuration under favorable conditions is performed on the circuits SW, the configuration is performed not only on the circuit SW31-32b but also on all the circuits SW that correspond to the second configuration data set (i.e., n² circuits SW including the circuits SW31-31b to SW3n-3nb) at a time. For this reason, configuration under favorable conditions can be performed in an extremely short time, as compared to a period in which correct configuration data is written to all the circuits SW that correspond to the second configuration data set (a period from the time T6 to the time T9).

Here, there seems to be concern that the data of the logic element LE32 which is an output destination of the circuit SW31-32 is changed because of the potential of the node ND32I that is forcibly set to the "L" level during a period from the time T5 to the time T6. However, in this embodiment, data of the logic element LE32 is prevented from being changed during the period from the time T5 to the time T6, through setting the potential of the signal line LEkeep at the "L" level to turn off the transistor M36 in the circuit ST32. Accordingly, an unintended logic operation of the logic element LE32 (a malfunction of the logic element LE32) caused by data variation can be prevented.

In addition, since the potential of the node ND31O is at the "H" level during the period from the time T5 to the time T6, there is concern that flow-through current may flow from the logic element LE31 through the transistor M34. However, by setting the signal CONTEXT[0] to the "L" level, all the circuits SW are turned off, and excessive flow of current can be suppressed. After that, by setting the potential of the signal line RESET3 to the "L" level and setting the signal CONTEXT[0] and the signal LEkeep to the "H" level, the potential of the node ND32I which has been forcibly set to the "L" level is released and a signal at the time T5 can be read again.

Next, during the period from the time T6 to the time T9, correct configuration data is written to all the circuits SW that correspond to the second configuration data set. First, during a period from the time T6 to a time T7, a signal at the "H" level is supplied to the signal line WL31[1], and correct configuration data is written to configuration memories of the circuits SW31-31b to SW3n-31b via signal lines BL31 to BL3n. For example, in FIG. 16, a signal at the "H" level is stored in the configuration memory of the circuit SW31-31b. Here, although configuration of the circuit SW31-31b is performed during a period in which the potential of the node ND32I is at the "H" level, configuration under favorable conditions is performed during the period from the time T5 to the time T6; accordingly, the speed of signal-transmission via the circuit SW31-31b can be kept at the improved state.

During a period from the time T7 to a time T8, a signal at the "H" level is supplied to the signal line WL32[1], and correct configuration data is written to configuration memories of the circuits SW31-32b to SW3n-32b via the signal lines BL31 to BL3n. For example, in FIG. 16, a signal at the "H" level is stored in the configuration memory of the circuit SW31-32b and a signal at the "L" level is stored in the configuration memory of the circuit SW32-32b. Here, in the configuration memory of the circuit SW31-32b, since configuration under favorable conditions is performed during the period from the time T5 to the time T6, change in configuration data does not occur.

During a period from the time T8 to the time T9, desired configuration data is written to the other configuration memories in a manner similar to those in the period from the time T6 to the time T7 and the period from the time T7 to the time T8. As described above, according to this embodiment, configuration under favorable conditions is performed on all the circuits SW that correspond to the second configuration data set during the period from the time T5 to the time T6. Therefore, when desired configuration data is written during the period from the time T6 to the time T9, reduction in the signal-transmission speed can be suppressed, regardless of the potential of the node ND32I.

Next, during a period from a time T10 to a time T11, the configuration data set to be selected is switched. That is, at the time T10, the signal CONTEXT[0] is set to the "L" level, and then the signal CONTEXT[1] is set to the "H" level, whereby the second configuration data set is selected.

At a time T12, the potential of the node ND31O is changed from the "H" level to the "L" level. At this time, although the potential of the node SN32 is stepped down to VDD because of the capacitive coupling via the gate capacitance of the transistor M32b, the gate-source voltage of the transistor M32b is VDD; thus, the potential of the node ND32I is immediately set to the "L" level.

At a time T13, the potential of the node ND31O is changed from the "L" level to the "H" level. At this time, the potential of the node SN32 is boosted because of the capacitive coupling via the gate capacitance of the transistor M32b. Therefore, the potential of the node ND32I is immediately set to the "H" level. That is, the speed of signal-transmission between the node ND31O and the node ND32I via the circuit SW31-32b improves.

As described above, a feature of the driving method of a semiconductor device described in this embodiment is, in the case where dynamic reconfiguration of the second configuration memories is performed while the semiconductor device (chip) operates with the circuit structure based on the configuration data held in the first configuration memories, a period in which configuration under favorable conditions is performed (a period in which configuration data under favorable conditions is written) on all the second configuration memories is provided separately from a period in which correct configuration data is written to the second configuration memories. By employing such a driving method, reduction in operation speed of the circuit SW can be suppressed, regardless of the conditions under which correct configuration data is written.

In addition, a novel semiconductor device that makes it possible to suppress reduction in the operation speed of the circuit SW can be provided.

Embodiment 4

In this embodiment, an example of a structure of a semiconductor device of one embodiment of the present invention will be described with reference to drawings.

Figure 8:
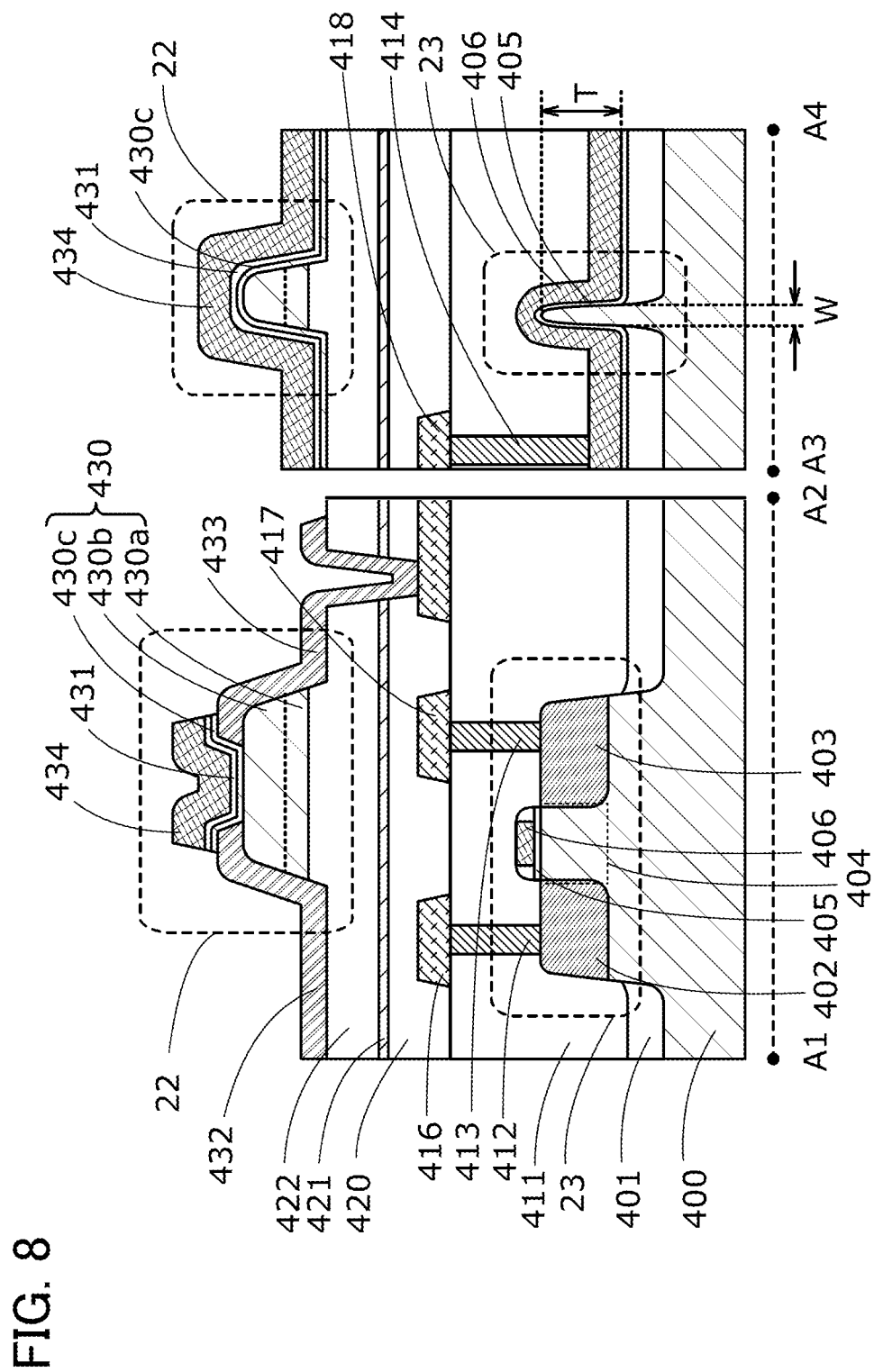
FIG. 8 shows an example of a structure of a semiconductor device.

A portion of the cross-sectional structure of the circuit SW21-22 shown in FIG. 2 is shown in FIG. 8. The structure of a transistor 23 in FIG. 8 can be used as the transistor M22a or the transistor M22b in FIG. 2, for example. In addition, the structure of a transistor 22 in FIG. 8 can be used as the transistor M21a or the transistor M21b in FIG. 2, for example.

In FIG. 8, a region along dashed line A1-A2 shows the cross-sectional structure of the transistors 22 and 23 in the channel length direction, and a region along dashed line A3-A4 shows the cross-sectional structure of the transistors 22 and 23 in the channel width direction. Note that, although a structure in which the channel length direction of the transistor 22 and the channel length direction of the transistor 23 are substantially the same (substantially parallel to each other) is shown in this embodiment, they do not necessarily have to be the same.

Here, the channel length direction of a transistor refers to a direction in which a carrier moves between a source (a source region or a source electrode) and a drain (a drain region or a drain electrode), and the channel width direction refers to a direction perpendicular to the channel length direction in a plane parallel to a substrate.

Furthermore, in FIG. 8, the transistor 22 includes an oxide semiconductor in its channel formation region, and the transistor 23 includes a single-crystal semiconductor in its channel formation region. In FIG. 8, a structure is shown in which the transistor 23 includes a single-crystal semiconductor in its channel formation region because of the use of a single-crystal substrate as a substrate 400. However, a structure in which a channel formation region is provided in a single-crystal semiconductor layer provided over a single-crystal substrate with an insulating layer positioned therebetween (a typical example of such a structure is an SOI substrate) may also be employed.

A silicon substrate, a germanium substrate, or a silicon germanium substrate can be used as a substrate 400, for example. In FIG. 8, an example in which a single-crystal silicon substrate is used as the substrate 400 is shown.

The transistor 23 is electrically isolated by an element isolation method. As the element isolation method, a selective oxidation method (a local oxidation of silicon (LOCOS) method), a trench isolation method (a shallow trench isolation (STI) method), or the like can be used. In FIG. 8, an example in which the transistor 23 is electrically isolated by trench isolation is shown. Specifically, in FIG. 8, the transistor 23 is electrically isolated by element isolation using an element isolation region 401 formed in such a manner that an insulator including silicon oxide or the like is buried in a trench formed in the substrate 400 by etching or the like and then the insulator is removed partly by etching or the like.

In a projection of the substrate 400 that exists in a region other than the trench, an impurity region 402 and an impurity region 403 of the transistor 23 and a channel formation region 404 placed between the impurity regions 402 and 403 are provided. Further, the transistor 23 includes an insulating film 405 covering the channel formation region 404 and a gate electrode 406 that overlaps with the channel formation region 404 with the insulating film 405 provided therebetween.

In the transistor 23, a side portion and an upper portion of the projection in the channel formation region 404 overlap with the gate electrode 406 with the insulating film 405 positioned therebetween, so that carriers flow in a wide area including the side portion and the upper portion of the channel formation region 404. Thus, the number of transferred carriers in the transistor 23 can be increased while an area over the substrate 400 occupied by the transistor 23 is reduced. As a result, the on-state current and field-effect mobility of the transistor 23 are increased. Suppose the length in the channel width direction (channel width) of the projection in the channel formation region 404 is W, and the thickness of the projection in the channel formation region 404 is T. When the aspect ratio of the thickness T to the channel width W is high, a region where carriers flow becomes larger. Thus, the on-state current of the transistor 23 can be further increased and the field-effect mobility can be further increased. Note that in the case of the transistor 23 formed using a bulk semiconductor substrate, the aspect ratio is preferably 0.5 or higher, more preferably 1 or higher.

An insulating film 411 is provided over the transistor 23. Openings are provided in the insulating film 411. Conductive films 412 and 413 that are electrically connected to the impurity regions 402 and 403, respectively, and a conductive film 414 that is electrically connected to the gate electrode 406 are provided in the openings.

The conductive film 412 is electrically connected to a conductive film 416 formed over the insulating film 411. The conductive film 413 is electrically connected to a conductive film 417 formed over the insulating film 411. The conductive film 414 is electrically connected to a conductive film 418 formed over the insulating film 411.

An insulating film 420 is provided over the conductive films 416 to 418. An insulating film 421 having an effect (blocking effect) of preventing diffusion of oxygen, hydrogen, or water is provided over the insulating film 420. As the insulating film 421 has higher density and becomes denser or has a fewer dangling bonds and becomes more chemically stable, the insulating film 421 has a higher blocking effect. As the insulating film having an effect of preventing diffusion of oxygen, hydrogen, or water, aluminum oxide, aluminum oxynitride, gallium oxide, gallium oxynitride, yttrium oxide, yttrium oxynitride, hafnium oxide, hafnium oxynitride, or the like can be used. As the insulating film having an effect of preventing diffusion of hydrogen or water, silicon nitride, silicon nitride oxide, or the like can be used.

An insulating film 422 is provided over the insulating film 421, and the transistor 22 is provided over the insulating film 422.

The transistor 22 includes, over the insulating film 422, a semiconductor film 430 containing an oxide semiconductor, conductive films 432 and 433 that are electrically connected to the semiconductor film 430, a gate insulating film 431 covering the semiconductor film 430, and a gate electrode 434 that overlaps with the semiconductor film 430 with the gate insulating film 431 positioned therebetween. Here, the conductive film 432 and the conductive film 433 have functions as a source electrode and a drain electrode. Furthermore, an opening is provided in the insulating films 420 to 422, and the conductive film 433 is electrically connected to the conductive film 418 in the opening.

Although the transistor 22 that includes the gate electrode 434 overlapping with the semiconductor film 430 with the gate insulating film 431 positioned therebetween is shown in FIG. 8, the present invention is not limited to this structure. That is, the transistor 22 may include another gate electrode overlapping with the semiconductor film 430 with the insulating film 422 positioned therebetween, in addition to the gate electrode 434 (i.e., a structure with a pair of gate electrodes).

In the case where the transistor 22 includes a pair of gate electrodes, a signal for controlling conduction or non-conduction of the transistor 22 may be supplied to one of the gate electrodes, and a potential from another electrode or wiring may be supplied to the other of the gate electrodes. In this case, potentials with the same level may be supplied to the pair of gate electrodes, or a fixed potential such as the ground potential may be supplied only to the other of the gate electrodes. By controlling the level of a potential supplied to the other of the gate electrodes, the threshold voltage of the transistor can be controlled.

Furthermore, although a structure in which the transistor 22 includes one channel formation region corresponding to the gate electrode 434 (i.e., a single gate structure) is shown as an example in FIG. 8, the transistor 22 may include a plurality of gate electrodes electrically connected to one another and a plurality of channel formation regions (i.e., a multi-gate structure).

Furthermore, although FIG. 8 shows as an example the transistor 22 in which oxide semiconductor films 430a to 430c are stacked in this order as the semiconductor film 430 over the insulating film 422, a single-layer oxide semiconductor film may be provided as the semiconductor film 430.

Figure 9A:
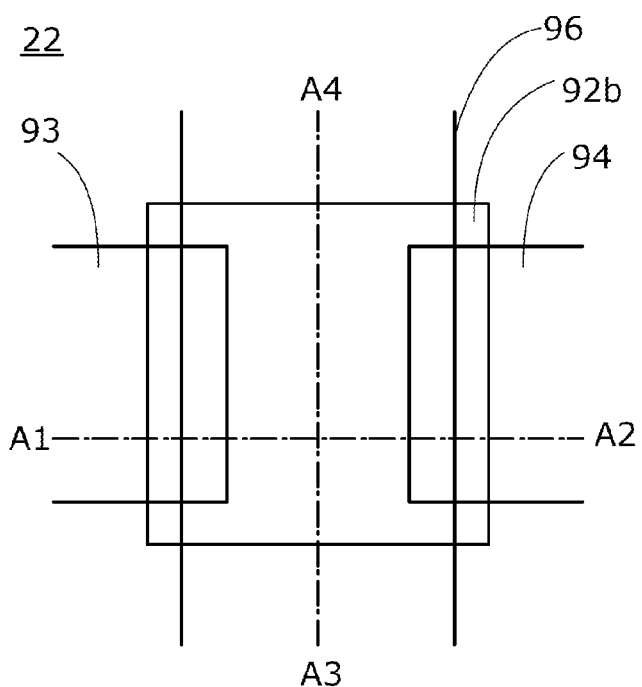
FIGS. 9A to 9C show an example of a structure of a semiconductor device.
Figure 9C:
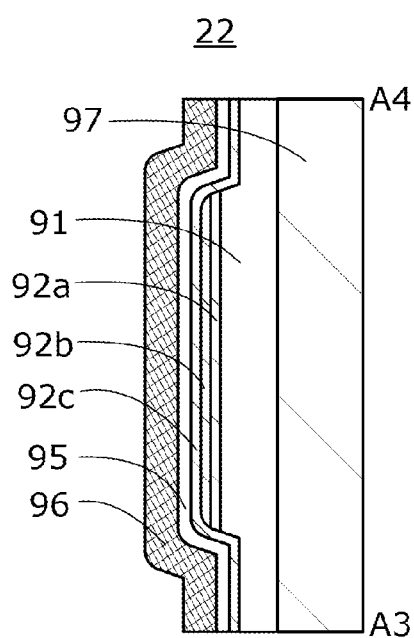
Figure 9B:
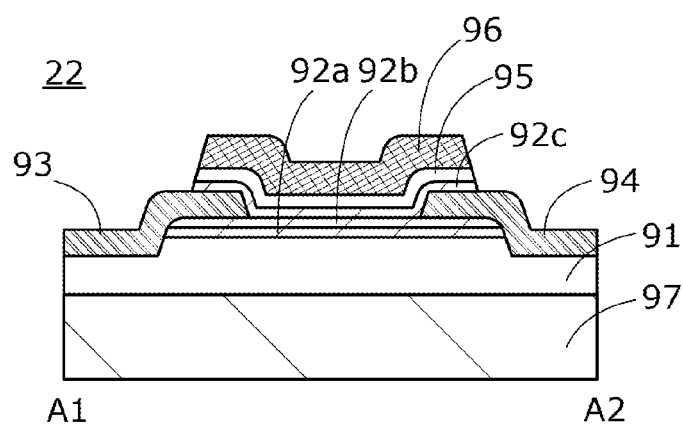

Next, the description is made on a structural example of a transistor 22 having a channel formation region in an oxide semiconductor film, with reference to FIGS. 9A to 9C.

FIG. 9A shows a top view of the transistor 22. Note that insulating films are not shown in FIG. 9A in order to make the layout of the transistor 22 clear. FIG. 9B is a cross-sectional view along the dashed line A1-A2 in the top view in FIG. 9A. FIG. 9C is a cross-sectional view along the dashed line A3-A4 in the top view in FIG. 9A.

As shown in FIG. 9A to 9C, the transistor 22 includes an oxide semiconductor film 92a and an oxide semiconductor film 92b that are stacked in this order over an insulating film 91 formed over an insulating surface 97; a conductive film 93 and a conductive film 94 that are electrically connected to the oxide semiconductor film 92b and have functions as a source electrode and a drain electrode; an oxide semiconductor film 92c over the oxide semiconductor film 92b, the conductive film 93, and the conductive film 94; an insulating film 95 that has a function as a gate insulating film and is located over the oxide semiconductor film 92c; and a conductive film 96 that has a function as a gate electrode, lies over the insulating film 95, and overlaps with the oxide semiconductor films 92a to 92c. Note that the insulating surface 97 may be a surface of a glass substrate, a semiconductor substrate, or the like or may be a surface of an element substrate where semiconductor elements are formed over a glass substrate or on a semiconductor substrate.

Next, the description is made on another structural example of a transistor 22 having a channel formation region in an oxide semiconductor film, with reference to FIGS. 10A to 10C.

FIG. 10A shows a top view of the transistor 22. Note that insulating films are not shown in FIG. 10A in order to make the layout of the transistor 22 clear. FIG. 10B is a cross-sectional view along the dashed line A1-A2 in the top view in FIG. 10A. FIG. 10C is a cross-sectional view along the dashed line A3-A4 in the top view in FIG. 10A.

As illustrated in FIGS. 10A to 10C, the transistor 22 includes the oxide semiconductor films 92a to 92c that are stacked in this order over the insulating film 91; the conductive films 93 and 94 that are electrically connected to the oxide semiconductor film 92c and have functions as a source electrode and a drain electrode; the insulating film 95 that has a function as a gate insulating film and is located over the oxide semiconductor film 92c and the conductive films 93 and 94; and the conductive film 96 that functions as a gate electrode, lies over the insulating film 95, and overlaps with the oxide semiconductor films 92a to 92c.

As described above, structures of the transistor 22 having a stacked structure of the oxide semiconductor films 92a to 92c are shown in FIGS. 9A to 9C and FIGS. 10A to 10C.

In the case where the transistor 22 includes the semiconductor film in which the semiconductor films 92a to 92c are stacked in this order, each of the oxide semiconductor films 92a and 92c is an oxide film that contains at least one of metal elements contained in the oxide semiconductor film 92b and in which energy at the conduction band minimum is closer to the vacuum level than that in the oxide semiconductor film 92b is by higher than or equal to 0.05 eV, 0.07 eV, 0.1 eV, or 0.15 eV and lower than or equal to 2 eV, 1 eV, 0.5 eV, or 0.4 eV. Furthermore, the oxide semiconductor film 92b preferably contains at least indium, in which case carrier mobility is increased.

In the case where the transistor 22 includes the semiconductor films with the above structure, when an electric field is applied to the semiconductor films by applying voltage to the gate electrode, a channel region is formed in the oxide semiconductor film 92b, which has the lowest conduction band minimum among the semiconductor films. That is, since the oxide semiconductor film 92c is provided between the oxide semiconductor film 92b and the insulating film 95, a channel region can be formed in the oxide semiconductor film 92b, which is separated from the insulating film 95.

Since the oxide semiconductor film 92c contains at least one of metal elements contained in the oxide semiconductor film 92b, interface scattering is unlikely to occur at the interface between the oxide semiconductor film 92b and the oxide semiconductor film 92c. Thus, the movement of carriers is unlikely to be inhibited at the interface, which results in an increase in the field-effect mobility of the transistor 22.

When an interface state is formed at an interface between the oxide semiconductor films 92b and 92a, a channel region is also formed in a region close to the interface; thus, the threshold voltage of the transistor 22 varies. However, since the oxide semiconductor film 92a contains at least one of metal elements contained in the oxide semiconductor film 92b, an interface state is unlikely to be formed at the interface between the oxide semiconductor film 92b and the oxide semiconductor film 92a. Accordingly, the above structure allows reducing of variations in the electrical characteristics of the transistor 22, such as the threshold voltage.

Further, it is preferable that a plurality of oxide semiconductor films be stacked so that an interface level due to an impurity existing between the oxide semiconductor films, which inhibits carrier flow, is not formed at an interface between the oxide semiconductor films. This is because when an impurity exists between the stacked oxide semiconductor films the continuity of the energies of the bottoms of the conduction bands of the oxide semiconductor films is lost, and carriers are trapped or disappear by recombination in the vicinity of the interface. By reducing an impurity existing between the films, a continuous junction (here, in particular, a well structure having a U shape in which energies of the bottoms of the conduction bands are changed continuously between the films) is formed easily as compared with the case of merely stacking the plurality of oxide semiconductor films which contain at least one common metal as a main component.

In order to form such a continuous energy band, it is necessary to form films continuously without being exposed to air, with use of a multi-chamber deposition apparatus (sputtering apparatus) including a load lock chamber. Each chamber of the sputtering apparatus is preferably evacuated to a high vacuum (to about $5 \times 10^{-7}$ Pa to $1 \times 10^{-4}$ Pa) by an adsorption vacuum pump such as a cryopump so that water and the like acting as impurities for the oxide semiconductor are removed as much as possible. Alternatively, a turbo molecular pump and a cold trap are preferably used in combination to prevent backflow of gas into the chamber through an evacuation system.

To obtain a highly purified intrinsic oxide semiconductor, not only high vacuum evacuation of the chambers but also high purification of a gas used in the sputtering is important. When an oxygen gas or an argon gas used as the above gas has a dew point of −40° C. or lower, preferably −80° C. or lower, further preferably −100° C. or lower and is highly purified, moisture and the like can be prevented from entering the oxide semiconductor film as much as possible. Specifically, in the case where the oxide semiconductor film 92b is an In-M-Zn oxide film (M is gallium (Ga), yttrium (Y), zirconium (Zr), lanthanum (La), cerium (Ce), or neodymium (Nd)) and a target having the atomic ratio of metal elements of In:M:Zn=$x_1$:$y_1$:$z_1$ is used for forming the oxide semiconductor film 92b, $x_1/y_1$ is preferably greater than or equal to ⅓ and less than or equal to 6, further preferably greater than or equal to 1 and less than or equal to 6, and $z_1/y_1$ is preferably greater than or equal to ⅓ and less than or equal to 6, further preferably greater than or equal to 1 and less than or equal to 6. Note that when $z_1/y_1$ is greater than or equal to 1 and less than or equal to 6, a c-axis aligned crystalline oxide semiconductor (CAAC-OS) film as the oxide semiconductor film 92b is easily formed. Typical examples of the atomic ratio of the metal elements of the target are In:M:Zn=1:1:1 and In:M:Zn=3:1:2.

Specifically, in the case where the oxide semiconductor film 92a and the oxide semiconductor film 92c are In-M-Zn oxide films and a target having the atomic ratio of metal elements of In:M:Zn=$x_2$:$y_2$:$z_2$ is used for forming the oxide semiconductor films 92a and 92c, $x_2/y_2$ is preferably less than $x_1/y_1$, and $z_2/y_2$ is preferably greater than or equal to ⅓ and less than or equal to 6, further preferably greater than or equal to 1 and less than or equal to 6. Note that when $z_2/y_2$ is greater than or equal to 1 and less than or equal to 6, CAAC-OS films are easily formed as the oxide semiconductor films 92a and 92c. Typical examples of the atomic ratio of the metal elements of the target are In:M:Zn=1:3:2, In:M:Zn=1:3:4, In:M:Zn=1:3:6, In:M:Zn=1:3:8.

The oxide semiconductor film 92a and the oxide semiconductor film 92c each have a thickness of more than or equal to 3 nm and less than or equal to 100 nm, preferably more than or equal to 3 nm and less than or equal to 50 nm. The thickness of the oxide semiconductor film 92b is more than or equal to 3 nm and less than or equal to 200 nm, preferably more than or equal to 3 nm and less than or equal to 100 nm, further preferably more than or equal to 3 nm and less than or equal to 50 nm.

In the three-layer semiconductor film, the three oxide semiconductor films 92a to 92c can be either amorphous or crystalline. Note that the oxide semiconductor film 92b in which a channel region is formed preferably has a crystalline structure, so that the transistor 22 can have stable electrical characteristics.

Note that a channel formation region refers to a region of a semiconductor film of the transistor 22 that overlaps with a gate electrode and is located between a source electrode and a drain electrode. Further, a channel region refers to a region through which current mainly flows in the channel formation region.

For example, when an In—Ga—Zn oxide film formed by a sputtering method is used as each of the oxide semiconductor films 92a and 92c, the oxide semiconductor films 92a and 92c can be deposited with the use of an In—Ga—Zn oxide target (In:Ga:Zn=1:3:2 [atomic ratio]). The deposition conditions can be as follows: an argon gas (flow rate: 30 sccm) and an oxygen gas (flow rate: 15 sccm) are used as the deposition gas; the pressure is 0.4 Pa; the substrate temperature is 200° C.; and the DC power is 0.5 kW.

Further, when the oxide semiconductor film 92b is a CAAC-OS film, the oxide semiconductor film 92b is preferably deposited with the use of a polycrystalline target containing an In—Ga—Zn oxide (In:Ga:Zn=1:1:1 [atomic ratio]). The deposition conditions can be as follows: an argon gas (flow rate: 30 sccm) and an oxygen gas (flow rate: 15 sccm) are used as the deposition gas; the pressure is 0.4 Pa; the substrate temperature is 300° C.; and the DC power is 0.5 kW.

Although the oxide semiconductor films 92a to 92c can be formed by a sputtering method, they may be formed by another method, e.g., a thermal CVD method. A metal organic chemical vapor deposition (MOCVD) method or an atomic layer deposition (ALD) method may be employed as a thermal CVD method.

There are few carrier generation sources in a highly purified oxide semiconductor (purified oxide semiconductor) obtained by reduction of impurities such as moisture and hydrogen serving as electron donors (donors) and reduction of oxygen vacancies; therefore, the highly purified oxide semiconductor can be an intrinsic (i-type) semiconductor or a substantially i-type semiconductor. For this reason, a transistor having a channel formation region in a highly purified oxide semiconductor film has extremely small off-state current and high reliability. Thus, a transistor in which a channel formation region is formed in the oxide semiconductor film easily has an electrical characteristic of a positive threshold voltage (also referred to as a normally-off characteristic).

Specifically, various experiments can prove small off-state current of a transistor having a channel formation region in a highly purified oxide semiconductor film. For example, even when an element has a channel width of $1 \times 10^6$ μm and a channel length of 10 μm, off-state current can be less than or equal to the measurement limit of a semiconductor parameter analyzer, i.e., less than or equal to $1 \times 10^{-13}$ A, at voltage (drain voltage) between the source electrode and the drain electrode of from 1 V to 10 V. In that case, it can be seen that off-state current standardized on the channel width of the transistor is lower than or equal to 100 zA/μm. In addition, a capacitor and a transistor are connected to each other and the off-state current is measured with a circuit in which charge flowing into or from the capacitor is controlled by the transistor. In the measurement, a highly-purified oxide semiconductor film was used for a channel formation region of the transistor, and the off-state current of the transistor was measured from a change in the amount of electrical charge of the capacitor per unit hour. As a result, it was found that, in the case where the voltage between the source electrode and the drain electrode of the transistor is 3 V, lower off-state current of several tens of yA/μm is obtained. Consequently, the transistor whose channel formation region is formed in a highly purified oxide semiconductor film has much lower off-state current than a transistor including silicon.

In a transistor including a highly purified oxide semiconductor film, off-state current hardly fluctuates in a wide range of temperature from −25° C. to 150° C. Thus, a transistor including a highly purified oxide semiconductor film has advantageous effects of extremely small off-state current and extremely low dependency on temperature, as compared to a transistor including silicon. In one embodiment of the present invention, a transistor having such a feature is used for the transistor M21a and the transistor M21b shown in FIG. 2; therefore, the configuration memory can be non-volatile in an extremely wide temperature range Note that a highly purified oxide semiconductor film in this specification refers to an oxide semiconductor film having a Fermi level whose difference from the intrinsic Fermi level is less than 0.5 eV. In that case, the carrier density of the oxide semiconductor film is lower than $1 \times 10^{17}/cm^3$ (preferably lower than $1 \times 10^{15}/cm^3$, further preferably lower than $1 \times 10^{13}/cm^3$).

In the case where an oxide semiconductor film is used as the semiconductor film, at least indium (In) or zinc (Zn) is preferably included in the oxide semiconductor film. In addition, as a stabilizer for reducing variation in electric characteristics of a transistor including the oxide semiconductor, it is preferable that one or more elements selected from gallium (Ga), tin (Sn), hafnium (Hf), aluminum (Al), and zirconium (Zr) be contained.

An In—Ga—Zn oxide and an In—Sn—Zn oxide among oxide semiconductors have the following advantages over silicon carbide, gallium nitride, and gallium oxide: transistors with excellent electrical characteristics can be formed by a sputtering method or a wet process and thus can be mass-produced easily. Further, unlike silicon carbide, gallium nitride, or gallium oxide, with the use of the In—Ga—Zn oxide, a transistor with favorable electrical characteristics can be formed over a glass substrate. Further, a larger substrate can be used.

As another stabilizer, one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor, any of the following oxides can be used, for example: indium oxide, gallium oxide, tin oxide, zinc oxide, an In—Zn oxide, an Sn—Zn oxide, an Al—Zn oxide, a Zn—Mg oxide, an Sn—Mg oxide, an In—Mg oxide, an In—Ga oxide, an In—Ga—Zn oxide (also referred to as IGZO), an In—Al—Zn oxide, an In—Sn—Zn oxide, an Sn—Ga—Zn oxide, an Al—Ga—Zn oxide, an Sn—Al—Zn oxide, an In—Hf—Zn oxide, an In—La—Zn oxide, an In—Pr—Zn oxide, an In—Nd—Zn oxide, an In—Ce—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, and an In—Hf—Al—Zn oxide.

For example, an In—Ga—Zn oxide refers to an oxide containing In, Ga, and Zn, and there is no limitation on the ratio between In, Ga, and Zn. Further, the In—Ga—Zn-based oxide may contain a metal element other than In, Ga, and Zn. The In—Ga—Zn oxide has sufficiently high resistance when no electric field is applied thereto, so that off-state current can be sufficiently reduced. Moreover, the In—Ga—Zn oxide has high mobility.

For example, high mobility can be obtained relatively easily in the case of using an In—Sn—Zn oxide. Meanwhile, when an In—Ga—Zn oxide is used, the mobility can be increased by reduction in the defect density in a bulk.

Furthermore, in the transistor 22, a metal in the source electrode and the drain electrode might extract oxygen from the oxide semiconductor film depending on a conductive material used for the source electrode and the drain electrode. In such a case, a region of the oxide semiconductor film in contact with the source electrode or the drain electrode becomes an n-type region because of the formation of an oxygen vacancy. The n-type region serves as a source region or a drain region, resulting in a decrease in the contact resistance between the oxide semiconductor film and the source electrode or the drain electrode. Accordingly, the formation of the n-type region increases the mobility and on-state current of the transistor 22, achieving the high-speed operation of a semiconductor device using the transistor 22.

A transistor that can operate at high speed can be used as the transistor 23 in FIG. 8. When the transistor 23 also includes an oxide semiconductor film, the transistor 23 is preferably formed in the same layer as the transistor 22. That is, films of an oxide semiconductor etched from the same starting film can constitute the transistors 22 and 23. Note that when the transistor 22 including an oxide semiconductor film is formed over the transistor 23 including an oxide semiconductor film, the degree of integration can be increased.

In addition, since the signal-transmission speed can be increased according to one embodiment of the present invention, even a transistor including an oxide semiconductor film that does not have an n-type region may be used as the transistor 23 in FIG. 8.

Note that the extraction of oxygen by a metal in the source electrode and the drain electrode is probably caused when the source electrode and the drain electrode are formed by a sputtering method or when heat treatment is performed after the formation of the source electrode and the drain electrode. The n-type region is more likely to be formed by forming the source electrode and the drain electrode with use of a conductive material which is easily bonded to oxygen. As the examples of the conductive material, aluminum (Al), chromium (Cr), copper (Cu), tantalum (Ta), titanium (Ti), molybdenum (Mo), tungsten (W), and the like can be given.

In the case where the semiconductor film including the stacked oxide semiconductor films is used in the transistor 22, the n-type region preferably extends to the oxide semiconductor film 92b serving as a channel region in order that the mobility and on-state current of the transistor 22 can be further increased and the semiconductor device can operate at higher speed.

The insulating film 91 preferably has a function of supplying part of oxygen to the oxide semiconductor films 92a to 92c by heating. It is preferable that the number of defects in the insulating film 91 be small, and typically the spin density of g=2.001 due to a dangling bond of silicon be lower than or equal to 1×10$^{18}$ spins/cm$^3$. The spin density is measured by electron spin resonance (ESR) spectroscopy.

The insulating film 91, which has a function of supplying part of oxygen to the oxide semiconductor films 92a to 92c by heating, is preferably an oxide. Examples of the oxide include aluminum oxide, magnesium oxide, silicon oxide, silicon oxynitride, silicon nitride oxide, gallium oxide, germanium oxide, yttrium oxide, zirconium oxide, lanthanum oxide, neodymium oxide, hafnium oxide, and tantalum oxide. The insulating film 91 can be formed by a plasma CVD (chemical vapor deposition) method, a sputtering method, or the like.

Note that in this specification, oxynitride contains more oxygen than nitrogen, and nitride oxide contains more nitrogen than oxygen.

Note that in the transistor 22 shown in FIGS. 9A to 9C or FIGS. 10A to 10C, the conductive film 96 overlaps with end portions of the oxide semiconductor film 92b including a channel region that do not overlap with the conductive films 93 and 94, i.e., end portions of the oxide semiconductor film 92b that are in a region different from a region where the conductive films 93 and 94 are located. When the end portions of the oxide semiconductor film 92b are exposed to plasma by etching for forming the end portions, a chlorine radical, a fluorine radical, or other radicals generated from an etching gas are easily bonded to a metal element contained in an oxide semiconductor. For this reason, in the end portions of the oxide semiconductor film, oxygen bonded to the metal element is easily eliminated, so that an oxygen vacancy is easily formed; thus, the oxide semiconductor film easily has n-type conductivity. However, an electric field applied to the end portions can be controlled by controlling the potential of the conductive film 96 because the end portions of the oxide semiconductor film 92b that do not overlap with the conductive films 93 and 94 overlap with the conductive film 96 in the transistor 22 illustrated in FIGS. 9A to 9C or FIGS. 10A to 10C. Consequently, current that flows between the conductive films 93 and 94 through the end portions of the oxide semiconductor film 92b can be controlled by the potential applied to the conductive film 96. In this specification, such a transistor structure is referred to as a surrounded channel (s-channel) structure.

With the s-channel structure, specifically, when a potential at which the transistor 22 is turned off is supplied to the conductive film 96, the amount of off-state current that flows between the conductive films 93 and 94 through the end portions can be reduced. For this reason, in the transistor 22, even when the distance between the conductive films 93 and 94 at the end portions of the oxide semiconductor film 92b is reduced as a result of reducing the channel length to obtain high on-state current, the transistor 22 can have low off-state current. Consequently, with the short channel length, the transistor 22 can have high on-state current when it is in an on state and low off-state current when it is in an off state.

With the s-channel structure, specifically, when a potential at which the transistor 22 is turned on is supplied to the conductive film 96, the amount of current that flows between the conductive films 93 and 94 through the end portions can be increased. The current contributes to an increase in the field-effect mobility and the on-state current of the transistor 22. When the end portions of the oxide semiconductor film 92b overlap with the conductive film 96, carriers flow in a wide region of the oxide semiconductor film 92b without being limited to a region in the vicinity of the interface of the oxide semiconductor film 92b close to the insulating film 95, which results in an increase in the amount of carrier movement in the transistor 22. As a result, the on-state current of the transistor 22 is increased, and the field-effect mobility is increased to greater than or equal to 10 cm$^2$V·s or to greater than or equal to 20 cm$^2$V·s, for example. Note that here, the field-effect mobility is not an approximate value of the mobility as the physical property of the oxide semiconductor film but is an index of current drive capability and the apparent field-effect mobility of a saturation region of the transistor.

A structure of the oxide semiconductor film will be described below.

In this specification, the term "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. In addition, the term "perpendicular" indicates that the angle formed between two straight lines is greater than or equal to 80° and less than or equal to 100°, and accordingly also includes the case where the angle is greater than or equal to 85° and less than or equal to 95°. The term "substantially perpendicular" indicates that the angle formed between two straight lines is greater than or equal to 60° and less than or equal to 120°.

In this specification, trigonal and rhombohedral crystal systems are included in a hexagonal crystal system.

An oxide semiconductor film is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example thereof is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor film. In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a form reflecting a surface over which the CAAC-OS film is formed (hereinafter, a surface over which the CAAC-OS film is formed is referred to as a formation surface) or a top surface of the CAAC-OS film, and is arranged parallel to the formation surface or the top surface of the CAAC-OS film.

On the other hand, according to the TEM image of the CAAC-OS film observed in a direction substantially perpendicular to the sample surface (plan-view TEM image), metal atoms are arranged in a triangular or hexagonal configuration in the crystal parts. However, there is no regularity of arrangement of metal atoms between different crystal parts.

From the observation of the cross-sectional TEM image and the plan-view TEM image, alignment is found in the crystal parts in the CAAC-OS film.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

When the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZnO$_4$, six peaks appear. The six peaks are derived from crystal planes equivalent to the (110) plane. In contrast, in the case of a CAAC-OS film, a peak is not clearly observed even when φ scan is performed with 2θ fixed at around 56°.

According to the above results, in the CAAC-OS film having c-axis alignment, while the directions of a-axes and b-axes are irregularly oriented between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ not appear at around 36°.

In a transistor including the CAAC-OS film, a change in electrical characteristics due to irradiation with visible light or ultraviolet light is small. Thus, the transistor has high reliability.

Note that an oxide semiconductor film may be a stacked film including two or more kinds of an amorphous oxide semiconductor film, a microcrystalline oxide semiconductor film, and a CAAC-OS film, for example.

For the deposition of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, and nitrogen) which exist in the treatment chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, migration occurs on the substrate when the sputtered particle reaches the substrate, so that a flat plane of the sputtered particle is attached to the substrate.

Furthermore, it is preferable that the proportion of oxygen in the deposition gas be increased and the power be optimized in order to reduce plasma damage at the deposition. The proportion of oxygen in the deposition gas is higher than or equal to 30 vol %, preferably 100 vol %.

As an example of the target, an In—Ga—Zn oxide target will be described below.

The In—Ga—Zn oxide target, which is polycrystalline, is made by mixing InO$_X$ powder, GaO$_Y$ powder, and ZnO$_Z$ powder in a predetermined molar ratio, applying pressure, and performing heat treatment at a temperature higher than or equal to 1000° C. and lower than or equal to 1500° C. Note that X, Y, and Z are each a given positive number. Here, the predetermined molar ratio of InO$_X$ powder to GaO$_Y$ powder and ZnO$_Z$ powder is, for example, 2:2:1, 8:4:3, 3:1:1, 1:1:1, 4:2:3, 2:1:3, or 3:1:2. The kinds of powder and the molar ratio for mixing powder may be determined as appropriate depending on the desired target. A CAAC-OS film formed using a target with a molar ratio of In:Ga:Zn=2:1:3 can have a particularly high proportion of regions where a diffraction pattern of CAAC-OS is observed in a predetermined area (also referred to as proportion of CAAC); thus, a transistor having a channel formation region in this CAAC-OS film can have excellent frequency characteristics.

An alkali metal is not an element included in an oxide semiconductor and thus is an impurity. Also, alkaline earth metal is an impurity in the case where the alkaline earth metal is not a component of the oxide semiconductor. Alkali metal, in particular, Na becomes Na$^+$ when an insulating film in contact with the oxide semiconductor film is an oxide and Na diffuses into the insulating film. Further, in the oxide semiconductor film, Na cuts or enters bonds between metal and oxygen which are included in the oxide semiconductor. As a result, for example, degradation of electrical characteristics of a transistor, such as a normally-on state of the transistor due to shift of the threshold voltage in the negative direction or reduction in mobility, occurs. In addition, variations in electrical characteristics also occur. Specifically, the Na concentration according to secondary ion mass spectrometry is reduced to preferably less than or equal to $5\times10^{16}/cm^3$, further preferably less than or equal to $1\times10^{16}/cm^3$, still further preferably less than or equal to $1\times10^{15}/cm^3$. In a similar manner, the measurement value of Li concentration is preferably less than or equal to $5\times10^{15}/cm^3$, more preferably less than or equal to $1\times10^{15}/cm^3$. In a similar manner, the measurement value of K concentration is preferably less than or equal to $5\times10^{15}/cm^3$, more preferably less than or equal to $1\times10^{15}/cm^3$.

In the case where a metal oxide containing indium is used, silicon or carbon having higher bond energy with oxygen than indium might cut the bond between indium and oxygen, so that an oxygen vacancy is formed. Accordingly, when silicon or carbon is contained in the oxide semiconductor film, the electric characteristics of the transistor are likely to deteriorate as in the case of an alkali metal or an alkaline earth metal. Thus, the concentration of silicon and the concentration of carbon in the oxide semiconductor film are preferably low. Specifically, the C concentration or the Si concentration measured by secondary ion mass spectrometry is preferably less than or equal to $1\times10^{18}/cm^3$. In this case, the deterioration of the electric characteristics of the transistor can be prevented, so that the reliability of a semiconductor device can be improved.

Embodiment 5

In this embodiment, a structural example of a semiconductor device of one embodiment of the present invention will be described with reference to drawings. In particular, a difference from the structure of the semiconductor device described in Embodiment 4 will be described in detail.

Figure 11:
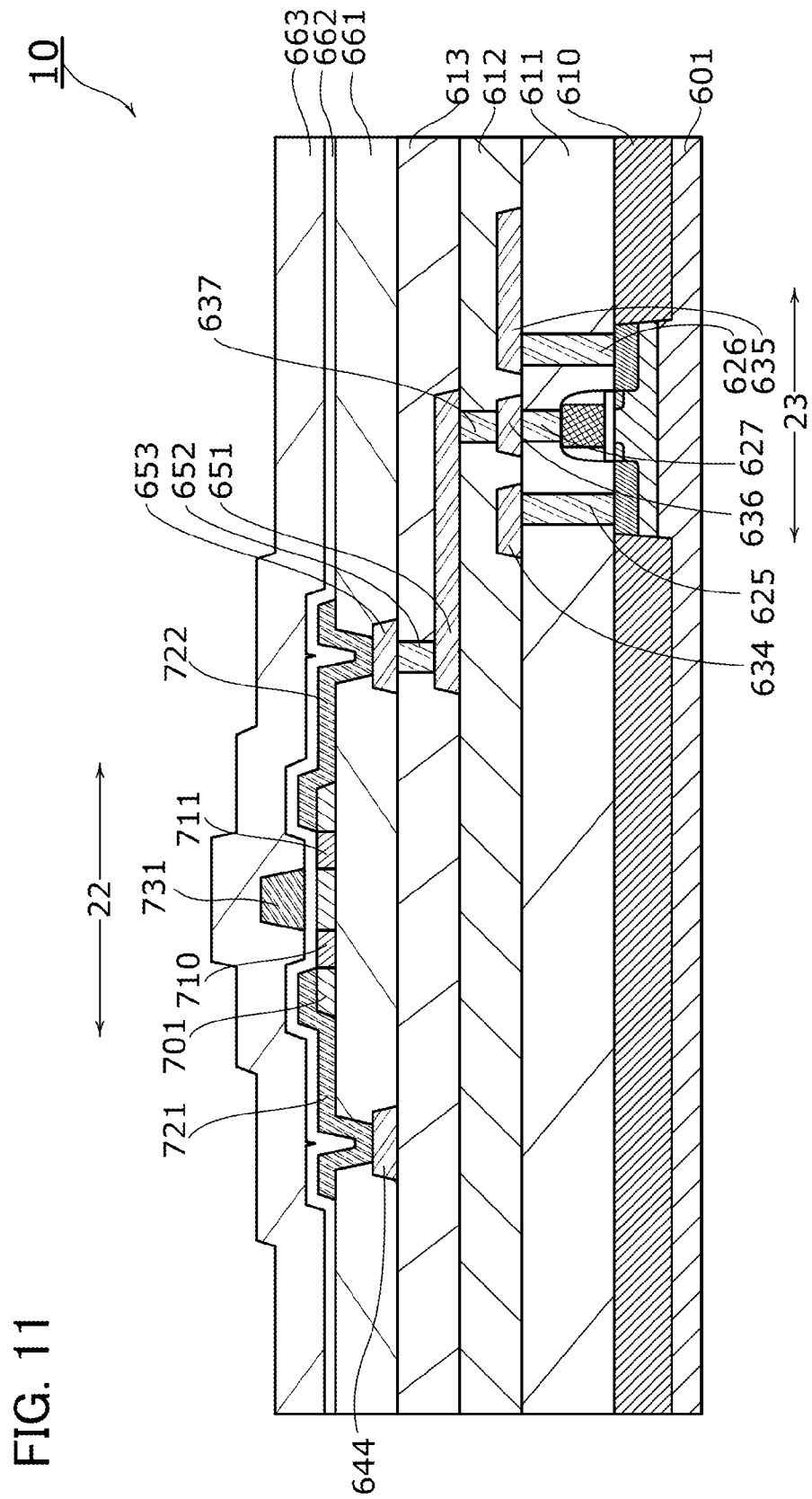
FIG. 11 shows an example of a structure of a semiconductor device.

Part of a cross-sectional structure of the circuit SW21-22 shown in FIG. 2 is shown in FIG. 11. The structure of a transistor 23 in FIG. 11 can be used for the transistor M22*a* and the transistor M22*b* in FIG. 2, for example. Furthermore, the structure of a transistor 22 in FIG. 11 can be used for the transistor M21*a* and the transistor M21*b* in FIG. 2, for example.

Since the structure of the transistor 23 has a lot in common with the structure of the transistor 23 in FIG. 8, only a brief explanation will be given here.

A semiconductor substrate 601 where the transistor 23 is formed can be, for example, a silicon substrate, a germanium substrate, or a silicon germanium substrate. In FIG. 11, an example in which a single crystal silicon substrate is used as the semiconductor substrate 601 is shown.

The transistor 23 is electrically isolated by an element isolation method. FIG. 11 shows an example in which the trench isolation method is used to electrically isolate the transistor 23. Specifically, in FIG. 11, the transistor 23 is electrically isolated by element isolation using an element isolation region 610 formed in such a manner that an insulator including silicon oxide or the like is buried in a trench formed in the semiconductor substrate 601 by etching or the like.

An insulating film 611 is provided over the transistor 23. Openings are provided in the insulating film 611. Conductive films 625 and 626 that are electrically connected to the source and the drain of the transistor 23 and a conductive film 627 that is electrically connected to the gate of the transistor 23 are formed in the openings.

The conductive film 625 is electrically connected to a conductive film 634 provided over the insulating film 611. The conductive film 626 is electrically connected to a conductive film 635 provided over the insulating film 611. The conductive film 627 is electrically connected to a conductive film 636 provided over the insulating film 611.

An insulating film 612 is provided over the conductive films 634 and 635. An opening is provided in the insulating film 612. A conductive film 637 electrically connected to the conductive film 636 is formed in the opening. The conductive film 637 is electrically connected to a conductive film 651 formed over the insulating film 612.

An insulating film 613 is provided over the conductive film 651. An opening is provided in the insulating film 613, and a conductive film 652 electrically connected to the conductive film 651 is provided in the opening. The conductive film 652 is electrically connected to a conductive film 653 provided over the insulating film 613. In addition, a conductive film 644 is provided over the insulating film 613.

An insulating film 661 is provided over the conductive film 653 and the conductive film 644. The transistor 22 is provided over the insulating film 661.

The transistor 22 includes a semiconductor film 701 that includes an oxide semiconductor; conductive films 721 and 722 over the semiconductor film 701, which function as a source and a drain; a gate insulating film 662 over the semiconductor film 701 and the conductive films 721 and 722; and a gate electrode 731 that is located over the gate insulating film 662 and overlaps with the semiconductor film 701 between the conductive films 721 and 722. Note that the conductive film 722 is electrically connected to the conductive film 653 in the opening formed in the insulating film 661.

The semiconductor film 701 has a region 710 between a region overlapping with the conductive film 721 and a region overlapping with the gate electrode 731 (i.e., a channel formation region). Similarly, the semiconductor film 701 has a region 711 between a region overlapping with the conductive film 722 and a region overlapping with the gate electrode 731. It is preferable that the region 710 and the region 711 each include a rare gas such as argon, an element that imparts p-type conductivity, or an element imparting n-type conductivity. This is because the regions 710 and 711 including such an element can have lower resistivity than the region overlapping with the gate electrode 731 (i.e., a channel formation region).

An insulating film 663 is provided over the transistor 22.

Although the transistor 22 that includes the gate electrode 731 overlapping with the semiconductor film 701 with the gate insulating film 662 sandwiched therebetween is shown in FIG. 11, the present invention is not limited to this structure. That is, the transistor 22 may include another gate electrode overlapping with the semiconductor film 701 with the insulating film 661 sandwiched therebetween, in addition to the gate electrode 731 (i.e., a structure with a pair of gate electrodes).

In the case where the transistor 22 includes a pair of gate electrodes, a signal for controlling conduction or non-conduction of the transistor 22 may be supplied to one of the gate electrodes, and a potential from another electrode or wiring may be supplied to the other of the gate electrodes. In this case, potentials with the same level may be supplied to the pair of gate electrodes, or a fixed potential such as the ground potential may be supplied only to the other of the gate electrodes. By controlling the level of a potential supplied to the other of the gate electrodes, the threshold voltage of the transistor can be controlled.

Furthermore, although a structure in which the transistor 22 includes one channel formation region corresponding to the gate electrode 731 (i.e., a single gate structure) is shown as an example in FIG. 11, the transistor 22 may include a plurality of gate electrodes electrically connected to one another and a plurality of channel formation regions (i.e., a multi-gate structure).

Furthermore, although FIG. 11 shows as an example the transistor 22 in which a single-layer oxide semiconductor film is provided as the semiconductor film 701 over the insulating film 661, a plurality of oxide semiconductor films may be stacked.

Embodiment 6

The semiconductor device of one embodiment of the present invention can be used for display devices, personal computers, image reproducing devices provided with recording media (typically, devices which reproduce the content of recording media such as digital versatile discs (DVDs) and have displays for displaying the reproduced images), or the like. Other examples of electronic devices that can include the semiconductor device according to one embodiment of the present invention are mobile phones, game machines including portable game consoles, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and medical equipment. FIGS. 12A to 12F show specific examples of these electronic devices.

Figure 12A:
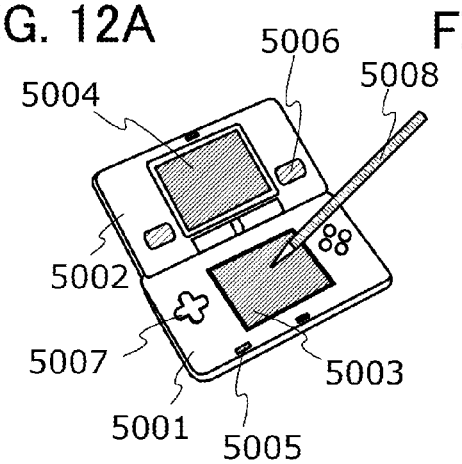
FIGS. 12A to 12F show examples of electronic devices.

FIG. 12A shows a portable game console including a housing 5001, a housing 5002, a display portion 5003, a display portion 5004, a microphone 5005, speakers 5006, operation keys 5007, a stylus 5008, and the like. The semiconductor device of one embodiment of the present invention can be used for a variety of integrated circuits incorporated in portable game consoles.

Figure 12B:
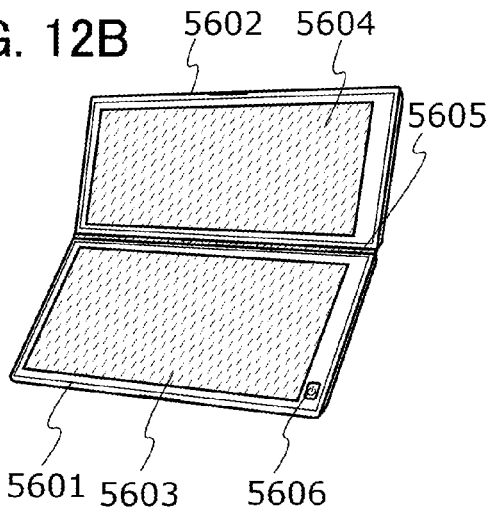

FIG. 12B shows a portable information terminal including a first housing 5601, a second housing 5602, a first display portion 5603, a second display portion 5604, a joint 5605, an operation key 5606, and the like. The semiconductor device of one embodiment of the present invention can be used for a variety of integrated circuits incorporated in portable information terminals. The first display portion 5603 is provided in the first housing 5601, and the second display portion 5604 is provided in the second housing 5602. The first housing 5601 and the second housing 5602 are connected to each other with the joint 5605, and the angle between the first housing 5601 and the second housing 5602 can be changed with the joint 5605. An image on the first display portion 5603 may be switched depending on the angle between the first housing 5601 and the second housing 5602 at the joint 5605. A display device with a position input function may be used as at least one of the first display portion 5603 and the second display portion 5604. Note that the position input function can be added by provision of a touch panel in a display device. Alternatively, the position input function can be added by provision of a photoelectric conversion element called a photosensor in a pixel portion of a display device.

Figure 12C:
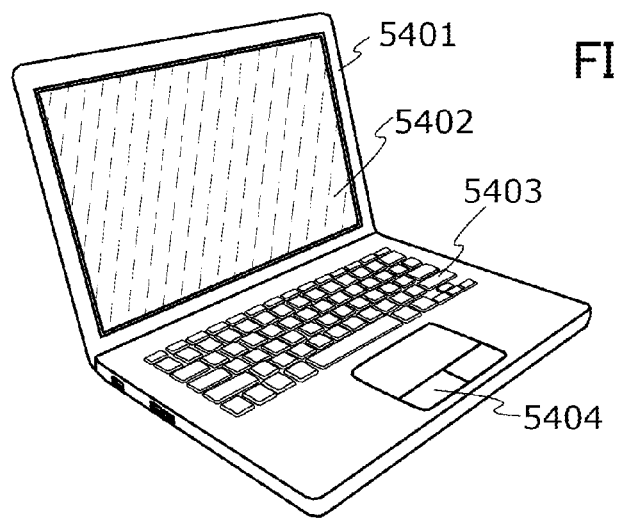

FIG. 12C shows a notebook personal computer including a housing 5401, a display portion 5402, a keyboard 5403, a pointing device 5404, and the like. The semiconductor device of one embodiment of the present invention can be used for a variety of integrated circuits incorporated in notebook personal computers.

Figure 12D:
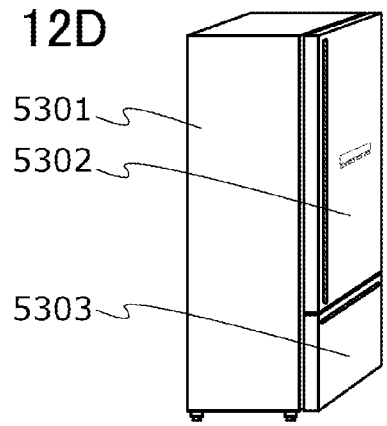

FIG. 12D illustrates an electric refrigerator-freezer, which includes a housing 5301, a refrigerator door 5302, a freezer door 5303, and the like. The semiconductor device of one embodiment of the present invention can be used for a variety of integrated circuits incorporated in electric refrigerator-freezers.

Figure 12E:
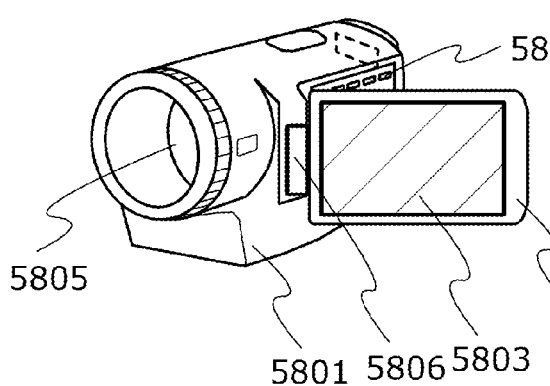

FIG. 12E shows a video camera, which includes a first housing 5801, a second housing 5802, a display portion 5803, operation keys 5804, a lens 5805, a joint 5806, and the like. The semiconductor device of one embodiment of the present invention can be used for a variety of integrated circuits incorporated in video cameras. The operation keys 5804 and the lens 5805 are provided in the first housing 5801, and the display portion 5803 is provided in the second housing 5802. The first housing 5801 and the second housing 5802 are connected to each other with the joint 5806, and the angle between the first housing 5801 and the second housing 5802 can be changed with the joint 5806. Images displayed on the display portion 5803 may be switched depending on the angle between the first housing 5801 and the second housing 5802 at the joint 5806.

Figure 12F:
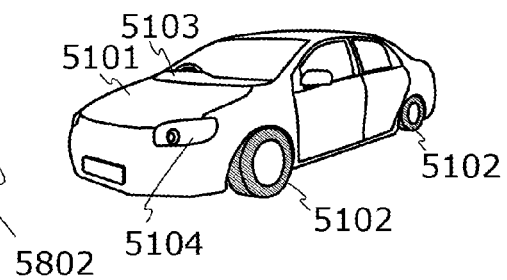

FIG. 12F shows an ordinary motor vehicle including a car body 5101, wheels 5102, a dashboard 5103, lights 5104, and the like. The semiconductor device of one embodiment of the present invention can be used for a variety of integrated circuits incorporated in automobiles.

Note that in this specification and the like, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y, can be expressed by using any of the following expressions.

The expressions include, for example, "X, Y, a source (or a first terminal or the like) of a transistor, and a drain (or a second terminal or the like) of the transistor are electrically connected to each other, and X the source (or the first terminal or the like) of the transistor, the drain (or the second terminal or the like) of the transistor, and Y are electrically connected to each other in this order", "a source (or a first terminal or the like) of a transistor is electrically connected to X a drain (or a second terminal or the like) of the transistor is electrically connected to Y, and X the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit structure is defined by an expression similar to the above examples, a source (or a first terminal or the like) and a drain (or a second terminal or the like) of a transistor can be distinguished from each other to specify the technical scope. Note that these expressions are examples and there is no limitation on the expressions. Here, X, Y, Z1, and Z2 each denote an object (e.g., a device, an element, a circuit, a wiring, an electrode, a terminal, a conductive film, and a layer).

This application is based on Japanese Patent Application serial no. 2014-050500 filed with Japan Patent Office on Mar. 13, 2014 and Japanese Patent Application serial no. 2014-051645 filed with Japan Patent Office on Mar. 14, 2014, the entire contents of which are hereby incorporated by reference.

What is claimed is:

1. A driving method of a semiconductor device, the semiconductor device comprising:
    a first logic element;
    a second logic element;
    a first circuit comprising a second circuit and a third circuit; and
    a first wiring,
    wherein each of the second circuit and the third circuit comprises:
        a first transistor;
        a second transistor;
        a third transistor; and
        a capacitor,
        wherein one of a source and a drain of the first transistor is electrically connected to the first wiring,
        wherein the other of the source and the drain of the first transistor is electrically connected to one electrode of the capacitor and a gate of the second transistor,
        wherein one of a source and a drain of the second transistor is electrically connected to the first logic element,
        wherein the other of the source and the drain of the second transistor is electrically connected to one of a source and a drain of the third transistor, and
        wherein the other of the source and the drain of the third transistor is electrically connected to the second logic element,
    the driving method comprising:
    a first period in which the third transistor in the third circuit remains off,
    wherein the first period includes a second period and a third period after the second period,
    wherein in the second period, the first transistor in the third circuit is turned on, a low potential is input to the one of the source and the drain of the second transistor in the third circuit and a high potential is input to the gate of the second transistor in the third circuit via the first transistor and the first wiring,
    wherein in the third period, second configuration data is written into the third circuit via the first wiring, and
    wherein conduction or non-conduction between the first logic element and the second logic element is set in accordance with first configuration data stored in the second circuit during the second period and the third period.

2. The driving method of the semiconductor device according to claim 1,
    wherein the third transistor in the second circuit remains on in the second period and the third period, and
    wherein supply of a clock signal to the first logic element is stopped in the second period.

3. The driving method of the semiconductor device according to claim 1,
    wherein the semiconductor device further comprises a fourth circuit electrically connected to the first circuit and the second logic element,
    wherein in the second period, the third transistor in the second circuit is turned off, and
    wherein data output from the second circuit is held by the fourth circuit after the third transistor in the second circuit is turned off in the second period.

4. The driving method of the semiconductor device according to claim 1,
    wherein the first transistor comprises an oxide semiconductor in a channel formation region.

5. The driving method of the semiconductor device according to claim 4,
    wherein the second transistor comprises a single-crystal silicon in a channel formation region.

6. The driving method of the semiconductor device according to claim 1,
    wherein the first logic element comprises a lookup table, a register, and an AND circuit,
    wherein the AND circuit comprises a first input terminal and a second input terminal,
    wherein a signal output from the lookup table is input to the register,
    wherein a signal output from the register is input to the first input terminal, and
    wherein the low potential is input to the second input terminal in the second period.

7. A driving method of a semiconductor device, the semiconductor device comprising:
    a first logic element;
    a second logic element;
    a first circuit comprising a second circuit and a third circuit;
    a fourth circuit electrically connected between the first circuit and the second logic element; and
    a first wiring,
    wherein each of the second circuit and the third circuit comprises:
        a first transistor;
        a second transistor;
        a third transistor; and
        a capacitor,
        wherein one of a source and a drain of the first transistor is electrically connected to the first wiring,
        wherein the other of the source and the drain of the first transistor is electrically connected to one electrode of the capacitor and a gate of the second transistor,
        wherein one of a source and a drain of the second transistor is electrically connected to one of a source and a drain of the third transistor,
        wherein the other of the source and the drain of the second transistor is electrically connected to the fourth circuit, and
        wherein the other of the source and the drain of the third transistor is electrically connected to the first logic element,
    the driving method comprising:
    a first period in which the third transistor in the third circuit remains off,
    wherein the first period includes a second period and a third period after the second period,
    wherein in the second period, the first transistor in the third circuit is turned on, a low potential is input to the one of the source and the drain of the second transistor in the third circuit via the fourth circuit, and a high potential is input to the gate of the second transistor in the third circuit via the first transistor and the first wiring,
    wherein in the third period, second configuration data is written into the third circuit via the first wiring, wherein in the third period, the second logic element and the first circuit are electrically disconnected from each other by the fourth circuit, and wherein conduction or non-conduction between the first logic element and the second logic element is set in accordance with first configuration data stored in the second circuit during the second period and the third period.

8. The driving method of the semiconductor device according to claim 7, wherein the semiconductor device further comprises a second wiring, wherein the fourth circuit comprises a fourth transistor and a fifth transistor, wherein one of a source and a drain of the fourth transistor is electrically connected to the second wiring, wherein the other of the source and the drain of the fourth transistor is electrically connected to the other of the source and the drain of the second transistor in each of the second circuit and the third circuit and one of a source and a drain of the fifth transistor, wherein the other of the source and the drain of the fifth transistor is electrically connected to the second logic element, wherein in the second period, the fourth transistor is turned on and the low potential supplied from the second wiring is input to the one of the source and the drain of the second transistor in the third circuit, and wherein the second logic element and the first circuit are electrically disconnected from each other by turning the fifth transistor off in the second period.

9. The driving method of the semiconductor device according to claim 8, wherein the third transistor in the second circuit is turned off in the second period.

10. The driving method of the semiconductor device according to claim 9, wherein the first transistor comprises an oxide semiconductor in a channel formation region.

11. The driving method of the semiconductor device according to claim 8, wherein the second transistor comprises a single-crystal silicon in a channel formation region.

12. A semiconductor device comprising:
a first logic element;
a second logic element;
a first circuit comprising a second circuit and a third circuit;
a fourth circuit configured to electrically disconnect the first logic element and the second logic element from each other;
a first wiring;
a second wiring; and
a third wiring,
wherein each of the second circuit and the third circuit comprises:
a first transistor;
a second transistor;
a third transistor; and
a capacitor,
wherein one of a source and a drain of the first transistor is electrically connected to the first wiring,
wherein the other of the source and the drain of the first transistor is electrically connected to one electrode of the capacitor and a gate of the second transistor,
wherein one of a source and a drain of the second transistor is electrically connected to one of a source and a drain of the third transistor,
wherein the other of the source and the drain of the second transistor is electrically connected to the fourth circuit, and
wherein the other of the source and the drain of the third transistor is electrically connected to the first logic element,
wherein a gate of the third transistor in the second circuit is electrically connected to the second wiring, and
wherein a gate of the third transistor in the third circuit is electrically connected to the third wiring.

13. The semiconductor device according to claim 12, further comprising a driver circuit, wherein the second wiring and the third wiring are electrically connected to the driver circuit.

14. The semiconductor device according to claim 12, further comprising a fourth wiring, a fifth wiring, and a sixth wiring, wherein the fourth circuit comprises a fourth transistor, an fifth transistor, a sixth transistor, and an inverter, wherein one of a source and a drain of the fourth transistor is electrically connected to the fourth wiring, wherein the other of the source and the drain of the fourth transistor is electrically connected to the other of the source and the drain of the second transistor in each of the second circuit and the third circuit, one of a source and a drain of the fifth transistor, one of a source and a drain of the sixth transistor, and an input terminal of the inverter, wherein the other of the source and the drain of the fifth transistor is electrically connected to the fifth wiring, wherein a gate of the fifth transistor is electrically connected to an output terminal of the inverter, wherein the other of the source and the drain of the sixth transistor is electrically connected to the second logic element, and wherein a gate of the sixth transistor is electrically connected to the fourth wiring.

15. The semiconductor device according to claim 12, wherein the first transistor comprises an oxide semiconductor in a channel formation region.

16. The semiconductor device according to claim 15, wherein the second transistor comprises a single-crystal silicon in a channel formation region.

* * * * *